United States Patent
Linnen et al.

(10) Patent No.: US 10,943,662 B1
(45) Date of Patent: Mar. 9, 2021

(54) DIFFERENT WORD LINE PROGRAMMING ORDERS IN NON-VOLATILE MEMORY FOR ERROR RECOVERY

(71) Applicant: Western Digital Technologies, Inc., San Jose, CA (US)

(72) Inventors: Daniel Linnen, Naperville, IL (US); Jayavel Pachamuthu, San Jose, CA (US); Kirubakaran Periyannan, Santa Clara, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/709,709

(22) Filed: Dec. 10, 2019

(51) Int. Cl.
*G11C 16/34* (2006.01)
*G11C 16/10* (2006.01)
*G11C 16/04* (2006.01)
*G11C 16/14* (2006.01)
*H01L 27/11582* (2017.01)
*G11C 11/56* (2006.01)

(52) U.S. Cl.
CPC .......... *G11C 16/10* (2013.01); *G11C 16/0483* (2013.01); *G11C 16/14* (2013.01); *G11C 16/3445* (2013.01); *G11C 16/3459* (2013.01); *H01L 27/11582* (2013.01); *G11C 11/5671* (2013.01)

(58) Field of Classification Search
CPC . G11C 16/10; G11C 16/3459; G11C 16/3445; G11C 16/0483; G11C 16/14; H01L 27/11582
See application file for complete search history.

(56) References Cited

U.S. PATENT DOCUMENTS

| | | |
|---|---|---|
| 7,289,344 B2 | 10/2007 | Chen |
| 8,174,905 B2 | 5/2012 | Shalvi et al. |
| 8,230,165 B2 | 7/2012 | Han |
| 8,400,839 B2 | 3/2013 | Li |
| 8,456,905 B2 | 6/2013 | Kasorla et al. |
| 9,218,886 B2 | 12/2015 | Dusija et al. |
| 9,466,369 B1 | 10/2016 | Pang et al. |
| 9,734,911 B2 | 8/2017 | Sinclair et al. |
| 2010/0246266 A1* | 9/2010 | Park .............. G11C 16/3495 365/185.11 |
| 2011/0292725 A1* | 12/2011 | Choi .............. G11C 16/10 365/185.03 |
| 2017/0125104 A1* | 5/2017 | Baran ............ G11C 16/349 |
| 2017/0256308 A1* | 9/2017 | Kang ............. G11C 16/0483 |
| 2019/0074065 A1* | 3/2019 | Park .............. G11C 16/3418 |
| 2020/0202962 A1* | 6/2020 | Chen ............. G11C 16/3427 |

OTHER PUBLICATIONS

U.S. Appl. No. 16/229,639, filed Dec. 21, 2018.

* cited by examiner

*Primary Examiner* — Mushfique Siddique
(74) *Attorney, Agent, or Firm* — Vierra Magen Marcus LLP

(57) ABSTRACT

An apparatus includes non-volatile memory and a control circuit configured to program the non-volatile memory. The control circuit is configured to change a programming order. In one aspect, the control circuit changes the order in which word lines are programmed from one point in time to another. In one aspect, the control circuit uses one order for programming one set of word lines and a different order for a different set of word lines. The sets of word lines could be in different sub-blocks, memory blocks, or memory dies. Such programming order differences can improve performance of error recovery.

18 Claims, 26 Drawing Sheets

1400

→ Program a set of word lines in a first 3D structure in a first order — 1402

→ Program a second set of word lines in a second 3D structure in a second order, the first and second sets of word lines at same levels of the first and second 3D structures — 1404

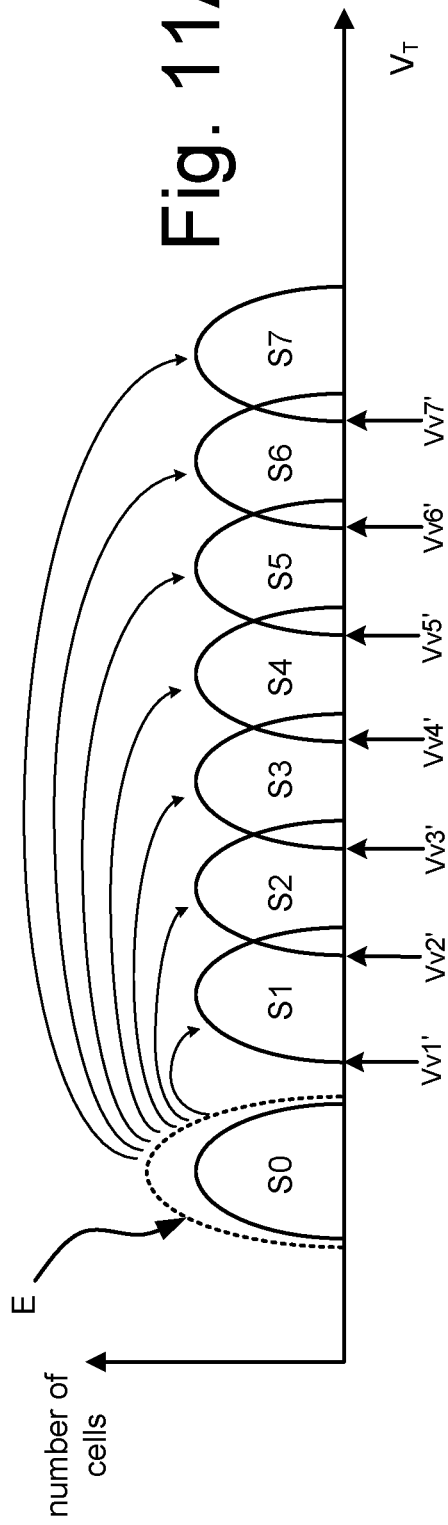
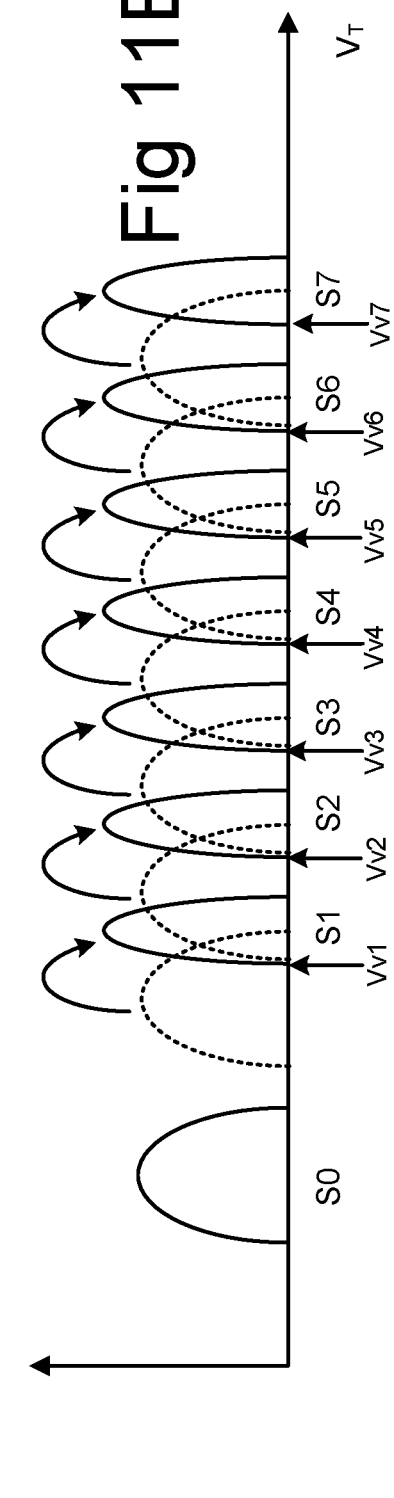

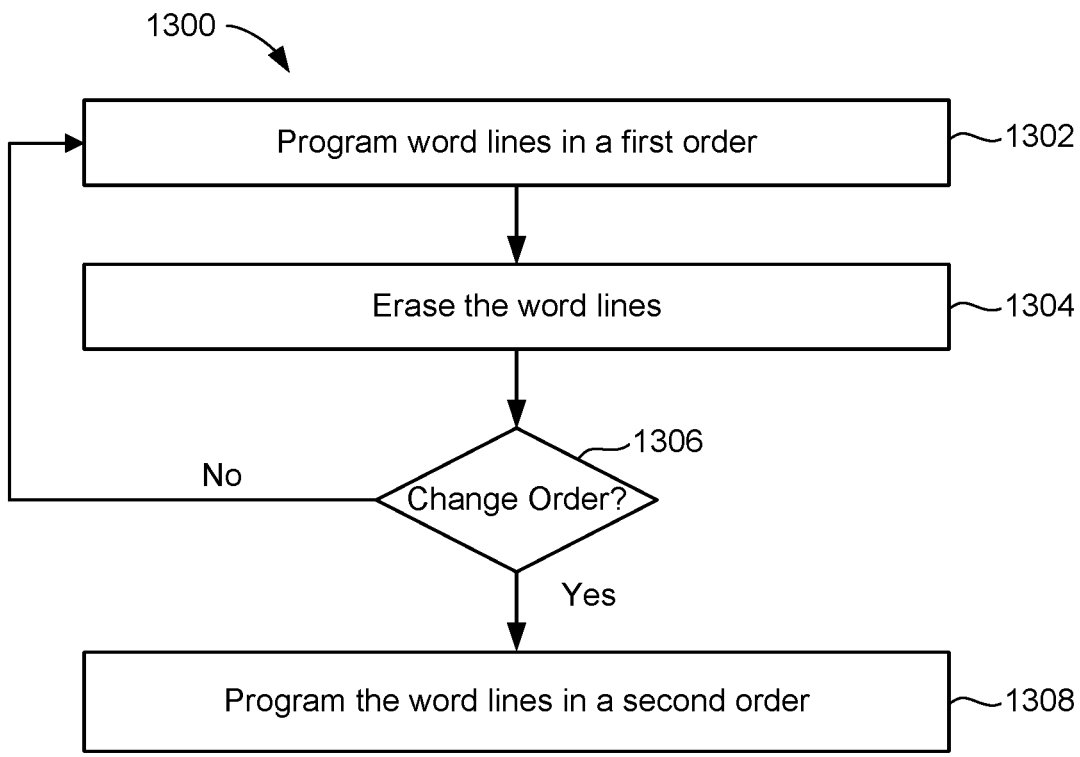
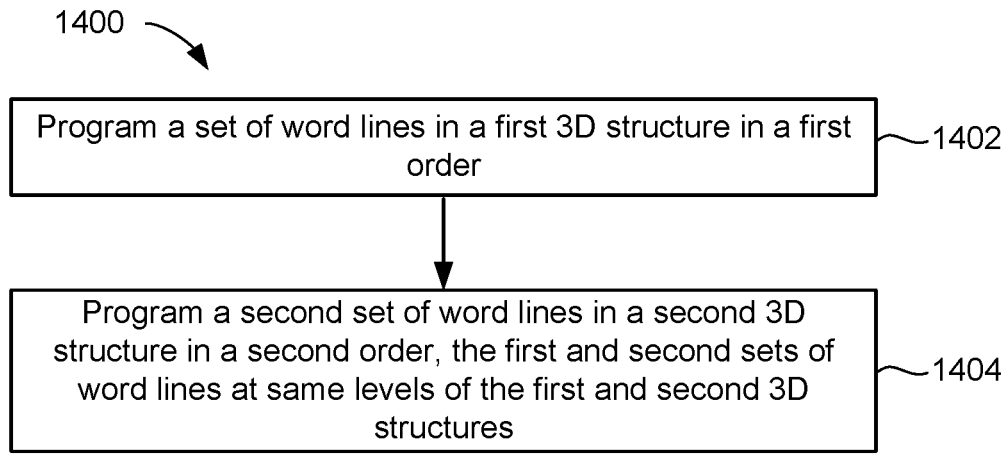

| WL | Die 0 | Die 1 | Die 2 | Die 3 | Die 4 | Die 5 | Die 6 | Die 7 |
|---|---|---|---|---|---|---|---|---|
| 0 | Page 0 | Page 1151 | Page 0 | Page 1151 | Page 0 | Page 1151 | Page 0 | Page 1151 |
| 0 | Page 1 | Page 1150 | Page 1 | Page 1150 | Page 1 | Page 1150 | Page 1 | Page 1150 |
| 0 | Page 2 | Page 1149 | Page 2 | Page 1149 | Page 2 | Page 1149 | Page 2 | Page 1149 |
| 0 | Page 3 | Page 1148 | Page 3 | Page 1148 | Page 3 | Page 1148 | Page 3 | Page 1148 |
| 0 | Page 4 | Page 1147 | Page 4 | Page 1147 | Page 4 | Page 1147 | Page 4 | Page 1147 |
| 0 | Page 5 | Page 1146 | Page 5 | Page 1146 | Page 5 | Page 1146 | Page 5 | Page 1146 |
| 0 | Page 6 | Page 1145 | Page 6 | Page 1145 | Page 6 | Page 1145 | Page 6 | Page 1145 |
| 0 | Page 7 | Page 1144 | Page 7 | Page 1144 | Page 7 | Page 1144 | Page 7 | Page 1144 |
| 0 | Page 8 | Page 1143 | Page 8 | Page 1143 | Page 8 | Page 1143 | Page 8 | Page 1143 |
| 0 | Page 9 | Page 1142 | Page 9 | Page 1142 | Page 9 | Page 1142 | Page 9 | Page 1142 |
| 0 | Page 10 | Page 1141 | Page 10 | Page 1141 | Page 10 | Page 1141 | Page 10 | Page 1141 |
| 0 | Page 11 | Page 1140 | Page 11 | Page 1140 | Page 11 | Page 1140 | Page 11 | Page 1140 |
| ... | ... | ... | ... | ... | ... | ... | ... | ... |
| 95 | Page 1140 | Page 11 | Page 1140 | Page 11 | Page 1140 | Page 11 | Page 1140 | Page 11 |
| 95 | Page 1141 | Page 10 | Page 1141 | Page 10 | Page 1141 | Page 10 | Page 1141 | Page 10 |
| 95 | Page 1142 | Page 9 | Page 1142 | Page 9 | Page 1142 | Page 9 | Page 1142 | Page 9 |
| 95 | Page 1143 | Page 8 | Page 1143 | Page 8 | Page 1143 | Page 8 | Page 1143 | Page 8 |
| 95 | Page 1144 | Page 7 | Page 1144 | Page 7 | Page 1144 | Page 7 | Page 1144 | Page 7 |
| 95 | Page 1145 | Page 6 | Page 1145 | Page 6 | Page 1145 | Page 6 | Page 1145 | Page 6 |
| 95 | Page 1146 | Page 5 | Page 1146 | Page 5 | Page 1146 | Page 5 | Page 1146 | Page 5 |
| 95 | Page 1147 | Page 4 | Page 1147 | Page 4 | Page 1147 | Page 4 | Page 1147 | Page 4 |
| 95 | Page 1148 | Page 3 | Page 1148 | Page 3 | Page 1148 | Page 3 | Page 1148 | Page 3 |
| 95 | Page 1149 | Page 2 | Page 1149 | Page 2 | Page 1149 | Page 2 | Page 1149 | Page 2 |
| 95 | Page 1150 | Page 1 | Page 1150 | Page 1 | Page 1150 | Page 1 | Page 1150 | Page 1 |
| 95 | Page 1151 | Page 0 | Page 1151 | Page 0 | Page 1151 | Page 0 | Page 1151 | Page 0 |

| WL | SB | Die 0 |
|---|---|---|
| 0 | 0 | Page 0 |
| 0 | 0 | Page 1 |
| 0 | 0 | Page 2 |
| 0 | 1 | Page 3 |
| 0 | 1 | Page 4 |
| 0 | 1 | Page 5 |
| 0 | 2 | Page 6 |
| 0 | 2 | Page 7 |
| 0 | 2 | Page 8 |
| 0 | 3 | Page 9 |
| 0 | 3 | Page 10 |
| 0 | 3 | Page 11 |
| ... | ... | ... |
| 95 | 0 | Page 1140 |
| 95 | 0 | Page 1141 |
| 95 | 0 | Page 1142 |
| 95 | 1 | Page 1143 |
| 95 | 1 | Page 1144 |
| 95 | 1 | Page 1145 |
| 95 | 2 | Page 1146 |
| 95 | 2 | Page 1147 |
| 95 | 2 | Page 1148 |
| 95 | 3 | Page 1149 |
| 95 | 3 | Page 1150 |
| 95 | 3 | Page 1151 |

1515 →

| WL | SB | Die 1 |
|---|---|---|
| 0 | 3 | Page 1151 |
| 0 | 3 | Page 1150 |
| 0 | 3 | Page 1149 |
| 0 | 2 | Page 1148 |
| 0 | 2 | Page 1147 |
| 0 | 2 | Page 1146 |
| 0 | 1 | Page 1145 |
| 0 | 1 | Page 1144 |
| 0 | 1 | Page 1143 |
| 0 | 0 | Page 1142 |
| 0 | 0 | Page 1141 |
| 0 | 0 | Page 1140 |
| ... | ... | ... |
| 95 | 3 | Page 11 |
| 95 | 3 | Page 10 |
| 95 | 3 | Page 9 |
| 95 | 2 | Page 8 |
| 95 | 2 | Page 7 |
| 95 | 2 | Page 6 |
| 95 | 1 | Page 5 |
| 95 | 1 | Page 4 |
| 95 | 1 | Page 3 |
| 95 | 0 | Page 2 |
| 95 | 0 | Page 1 |
| 95 | 0 | Page 0 |

| WL | SB | Die 0 |
|---|---|---|
| 0 | 0 | Page 0 |
| 0 | 0 | Page 1 |
| 0 | 0 | Page 2 |
| 0 | 1 | Page 3 |
| 0 | 1 | Page 4 |
| 0 | 1 | Page 5 |
| 0 | 2 | Page 6 |
| 0 | 2 | Page 7 |
| 0 | 2 | Page 8 |
| 0 | 3 | Page 9 |
| 0 | 3 | Page 10 |
| 0 | 3 | Page 11 |
| ... | ... | ... |
| 95 | 0 | Page 1140 |
| 95 | 0 | Page 1141 |
| 95 | 0 | Page 1142 |
| 95 | 1 | Page 1143 |
| 95 | 1 | Page 1144 |
| 95 | 1 | Page 1145 |
| 95 | 2 | Page 1146 |
| 95 | 2 | Page 1147 |
| 95 | 2 | Page 1148 |
| 95 | 3 | Page 1149 |
| 95 | 3 | Page 1150 |
| 95 | 3 | Page 1151 |

1525 →

| WL | SB | Die 1 |
|---|---|---|
| 0 | 0 | Page 1151 |
| 0 | 0 | Page 1150 |
| 0 | 0 | Page 1149 |
| 0 | 1 | Page 1148 |
| 0 | 1 | Page 1147 |
| 0 | 1 | Page 1146 |
| 0 | 2 | Page 1145 |
| 0 | 2 | Page 1144 |
| 0 | 2 | Page 1143 |
| 0 | 3 | Page 1142 |
| 0 | 3 | Page 1141 |
| 0 | 3 | Page 1140 |
| ... | ... | ... |
| 95 | 0 | Page 11 |
| 95 | 0 | Page 10 |
| 95 | 0 | Page 9 |
| 95 | 1 | Page 8 |
| 95 | 1 | Page 7 |
| 95 | 1 | Page 6 |
| 95 | 2 | Page 5 |
| 95 | 2 | Page 4 |
| 95 | 2 | Page 3 |
| 95 | 3 | Page 2 |
| 95 | 3 | Page 1 |
| 95 | 3 | Page 0 |

| WL | SB | Die 0 |
|---|---|---|
| 0 | 0 | Page 0 |
| 0 | 0 | Page 1 |
| 0 | 0 | Page 2 |
| 1 | 0 | Page 3 |
| 1 | 0 | Page 4 |
| 1 | 0 | Page 5 |
| 2 | 0 | Page 6 |
| 2 | 0 | Page 7 |
| 2 | 0 | Page 8 |
| 3 | 0 | Page 9 |
| 3 | 0 | Page 10 |
| 3 | 0 | Page 11 |
| ... | ... | ... |
| 92 | 3 | Page 1140 |
| 92 | 3 | Page 1141 |
| 92 | 3 | Page 1142 |
| 93 | 3 | Page 1143 |
| 93 | 3 | Page 1144 |
| 93 | 3 | Page 1145 |
| 94 | 3 | Page 1146 |
| 94 | 3 | Page 1147 |
| 94 | 3 | Page 1148 |
| 95 | 3 | Page 1149 |
| 95 | 3 | Page 1150 |
| 95 | 3 | Page 1151 |

1550 →

| WL | SB | Die 1 |
|---|---|---|
| 0 | 0 | Page 1151 |
| 0 | 0 | Page 1150 |
| 0 | 0 | Page 1149 |
| 1 | 0 | Page 1148 |
| 1 | 0 | Page 1147 |
| 1 | 0 | Page 1146 |
| 2 | 0 | Page 1145 |
| 2 | 0 | Page 1144 |
| 2 | 0 | Page 1143 |
| 3 | 0 | Page 1142 |
| 3 | 0 | Page 1141 |
| 3 | 0 | Page 1140 |
| ... | ... | ... |
| 92 | 3 | Page 11 |
| 92 | 3 | Page 10 |
| 92 | 3 | Page 9 |
| 93 | 3 | Page 8 |
| 93 | 3 | Page 7 |
| 93 | 3 | Page 6 |
| 94 | 3 | Page 5 |
| 94 | 3 | Page 4 |
| 94 | 3 | Page 3 |
| 95 | 3 | Page 2 |
| 95 | 3 | Page 1 |
| 95 | 3 | Page 0 |

1560 →

| WL | SB | Die 1 |
|---|---|---|
| 0 | 3 | Page 1151 |
| 0 | 3 | Page 1150 |
| 0 | 3 | Page 1149 |
| 1 | 3 | Page 1148 |
| 1 | 3 | Page 1147 |
| 1 | 3 | Page 1146 |
| 2 | 3 | Page 1145 |
| 2 | 3 | Page 1144 |
| 2 | 3 | Page 1143 |
| 3 | 3 | Page 1142 |
| 3 | 3 | Page 1141 |
| 3 | 3 | Page 1140 |
| ... | ... | ... |
| 92 | 0 | Page 11 |
| 92 | 0 | Page 10 |
| 92 | 0 | Page 9 |
| 93 | 0 | Page 8 |
| 93 | 0 | Page 7 |
| 93 | 0 | Page 6 |
| 94 | 0 | Page 5 |
| 94 | 0 | Page 4 |
| 94 | 0 | Page 3 |
| 95 | 0 | Page 2 |
| 95 | 0 | Page 1 |
| 95 | 0 | Page 0 |

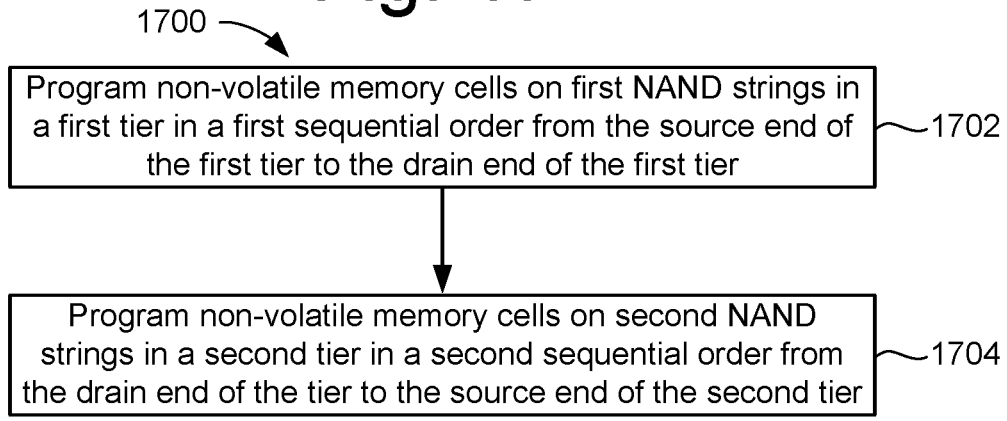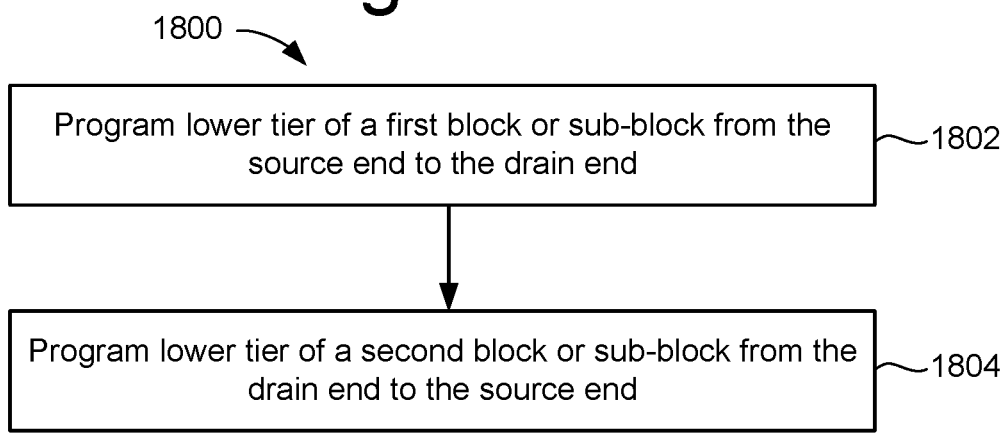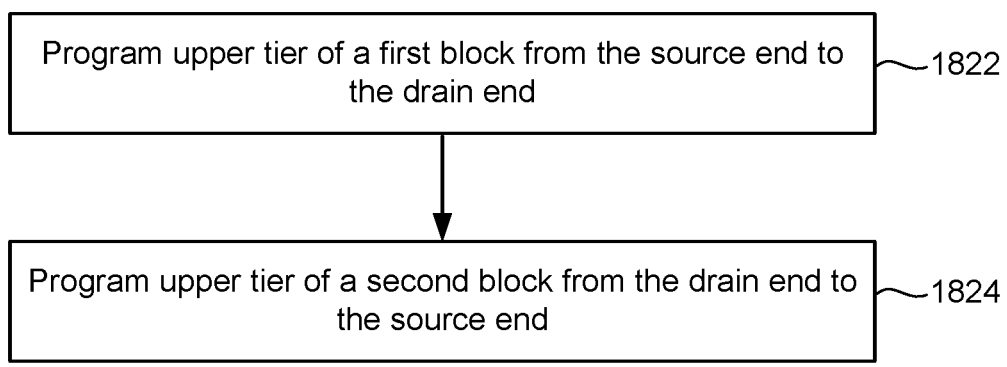

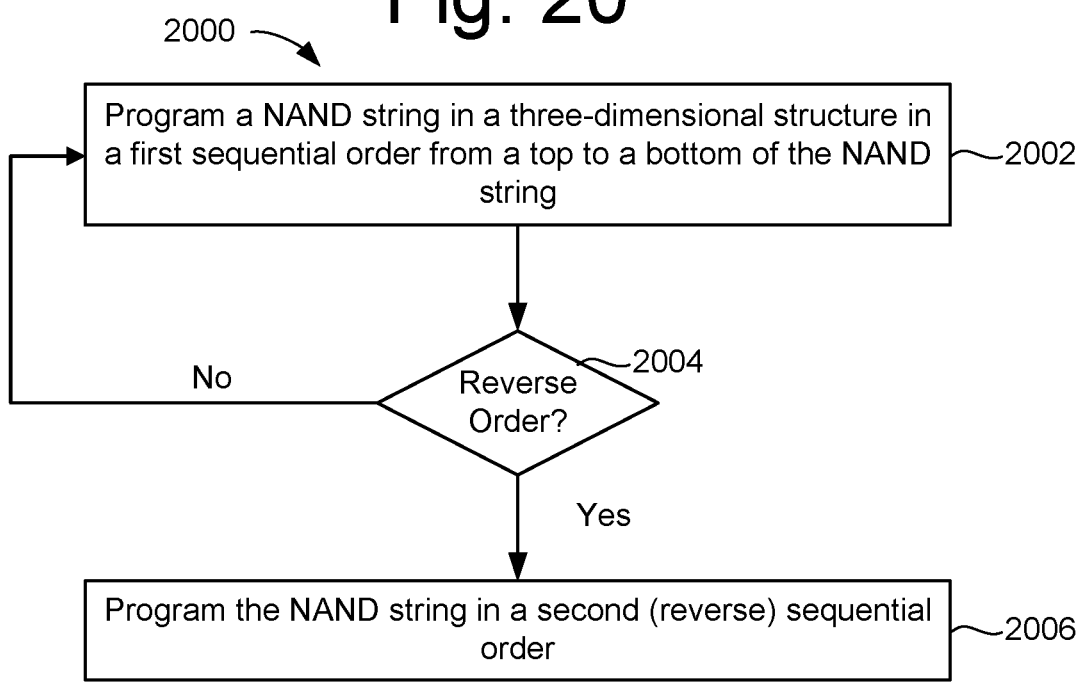
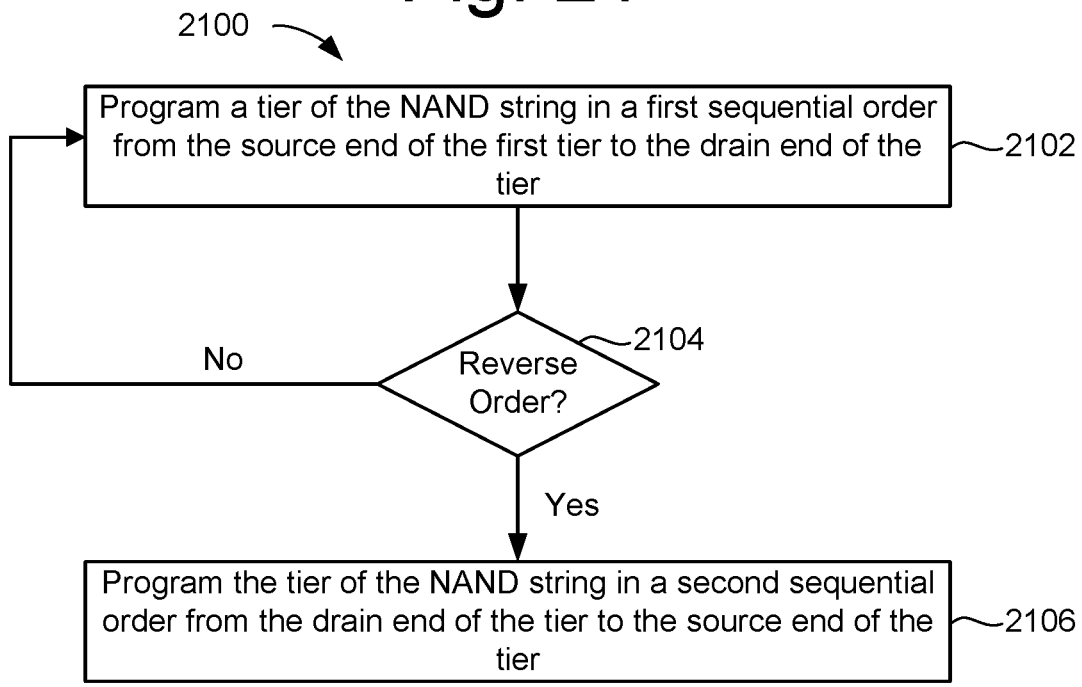

| Physical WL | Die 0 | Die 1 | Die 2 | Die 3 | Die 4 | Die 5 | Die 6 | Die 7 |
|---|---|---|---|---|---|---|---|---|
| 0 | Good | Bad | Good | Good | Good | Good | Good | Bad |
| 1 | Good | Bad | Good | Good | Good | Good | Good | Bad |
| 2 | Good | Bad | Good | Good | Good | Good | Good | Bad |
| 3 | Good | Good | Good | Good | Good | Good | Good | Good |
| 4 | Good | Good | Good | Good | Good | Good | Good | Good |
| 5 | Good | Good | Good | Good | Good | Good | Good | Good |
| ... | ... | ... | ... | ... | ... | ... | ... | ... |
| 90 | Good | Good | Good | Good | Good | Good | Good | Good |
| 91 | Good | Good | Good | Good | Good | Good | Good | Good |
| 92 | Good | Good | Good | Good | Good | Good | Good | Good |
| 93 | Bad | Good | Good | Bad | Good | Good | Bad | Good |
| 94 | Bad | Good | Good | Bad | Good | Good | Bad | Good |
| 95 | Bad | Good | Good | Bad | Good | Good | Bad | Good |

| Logical WL | Die 0 | Die 1 | Die 2 | Die 3 | Die 4 | Die 5 | Die 6 | Die 7 |
|---|---|---|---|---|---|---|---|---|
| 0 | Good | Good | Good | Good | Good | Good | Good | Good |
| 1 | Good | Good | Good | Good | Good | Good | Good | Good |
| 2 | Good | Good | Good | Good | Good | Good | Good | Good |
| 3 | Good | Good | Good | Good | Good | Good | Good | Good |
| 4 | Good | Good | Good | Good | Good | Good | Good | Good |
| 5 | Good | Good | Good | Good | Good | Good | Good | Good |
| ... | ... | ... | ... | ... | ... | ... | ... | ... |
| 90 | Good | Good | Good | Good | Good | Good | Good | Good |
| 91 | Good | Good | Good | Good | Good | Good | Good | Good |
| 92 | Good | Good | Good | Good | Good | Good | Good | Good |
| 93 | Bad | Bad | Good | Bad | Good | Good | Bad | Bad |
| 94 | Bad | Bad | Good | Bad | Good | Good | Bad | Bad |
| 95 | Bad | Bad | Good | Bad | Good | Good | Bad | Bad |

2214

DIFFERENT WORD LINE PROGRAMMING ORDERS IN NON-VOLATILE MEMORY FOR ERROR RECOVERY

BACKGROUND

Many electronic devices make use of an embedded or otherwise connected storage device. Often, the embedded or connected storage device includes non-volatile memory. A host refers to a device that makes use of a storage device. A host can be connected to the storage device, or the storage device can be embedded within the host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a storage device that uses semiconductor based non-volatile memory is a solid state device ("SSD").

Due to various factors, the data that is read back from the non-volatile memory might not be the same as the data that was originally programmed. There are various techniques to help recover from such situations, including calculating Error Correction Codes (ECC) when data is being written and checking the ECC when data is read from the non-volatile memory. However, such techniques can be time consuming and might not be successful.

BRIEF DESCRIPTION OF THE DRAWINGS

Like-numbered elements refer to common components in the different Figures.

FIGS. 11A and 11B describe one example of a multi-phase programming operation having a coarse phase and a fine phase.

FIG. 13 is a flow chart of one embodiment of a process of programming non-volatile memory, which includes changing an order of programming word lines.

FIG. 14 is a flow chart of one embodiment of a process of programming non-volatile memory, which includes uses a different order of programming one set of word lines relative to another set of word lines.

FIG. 15A depicts one example of how meta-pages can be programmed using the process of FIG. 14.

FIGS. 15B and 15C depict two possible orders for programming the sub-blocks.

FIG. 15D depicts examples of possible orders for programing memory cells.

FIG. 17 is a flow chart of one embodiment of a process of programming NAND strings in different sequential orders.

FIG. 18A is a flow chart of one embodiment of a process programming non-volatile memory cells in a lower tier.

FIG. 18B is a flow chart of one embodiment of a process programming non-volatile memory cells in an upper tier.

FIG. 20 is a flow chart of one embodiment of a process of reversing an order in which a NAND string is programmed.

FIG. 21 is a flow chart of one embodiment of a process of reversing an order in which a portion of a NAND string is programmed.

FIGS. 22A and 22B depict tables to illustrate how reversing a program order can provide for a larger contiguous chunk of good word lines.

DETAILED DESCRIPTION

Figure 1A:
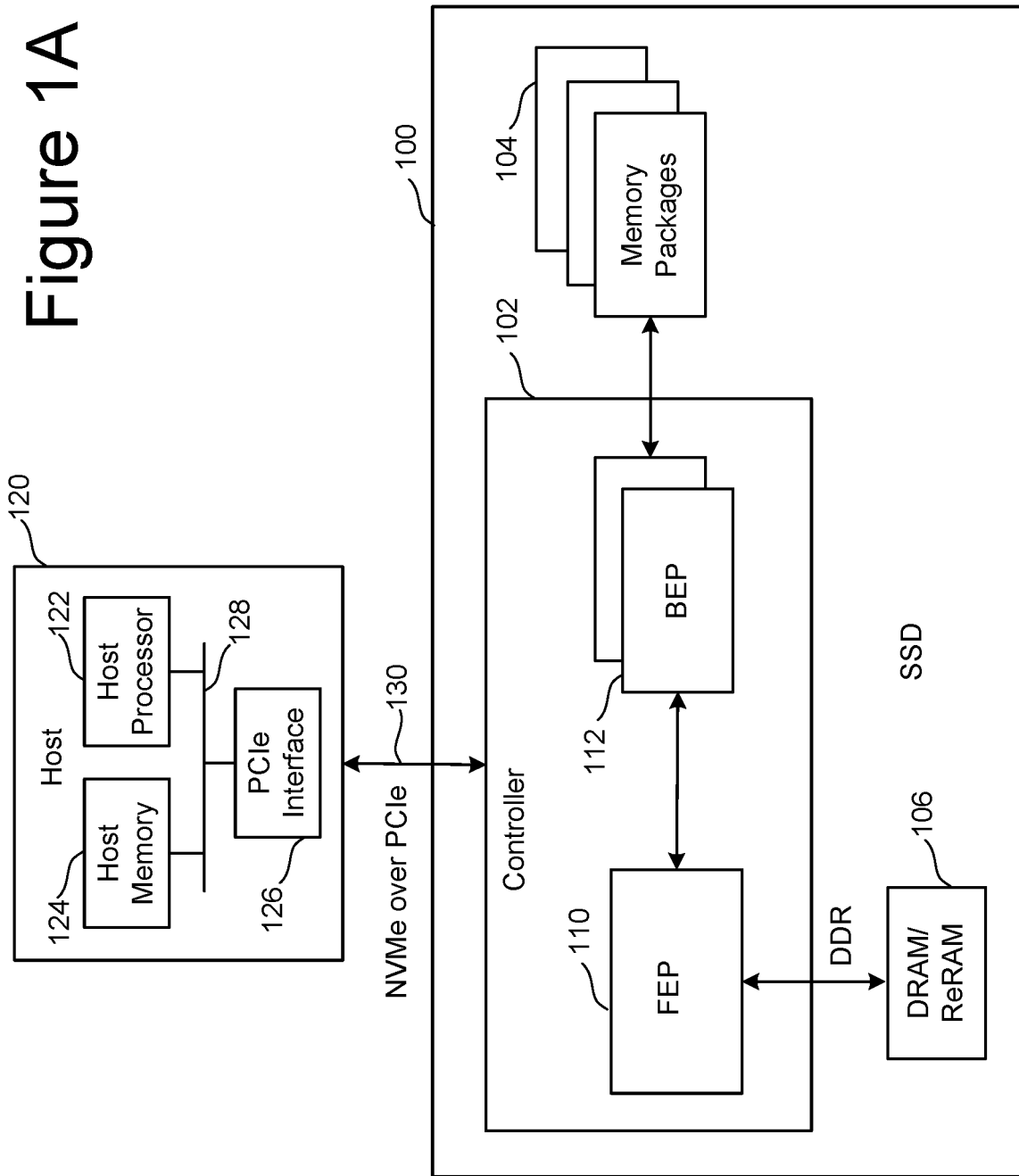
FIG. 1A is a block diagram of one embodiment of a storage device connected to a host.

Technology is proposed for programming non-volatile storage in which the system uses different word line programming orders in order to improve error recovery. In some embodiments, the order in which a set of word lines is programmed is changed over time, which may improve error recovery. In some embodiments, the change is a reverse of the programming order. In some embodiments, different sets of word lines are programmed in different orders, which may improve error recovery. In some embodiments, the programming order is varied (e.g., reversed) by memory die, memory block (or "block") and/or program/erase cycle count.

The basic unit of storage in non-volatile storage systems is a memory cell. In some storage devices, memory cells are joined to one another such as in NAND strings in a block or sub-block. Each NAND string comprises a number of memory cells connected in series between one or more drain end select gate transistors (referred to as SGD transistors) and one or more source end select gate transistors (referred to as SGS transistors). The SGD transistors are on a drain end of the NAND string, which is connected to a bit line. The SGS transistors are on a source end of the NAND string, which is connected to a source line. Further, the memory cells can be arranged with common control gate lines (e.g., word lines), which act as control gates. A set of word lines extends from the source end of a block to the drain end of a block. Memory cells can be connected in other types of strings and in other ways as well.

In a three-dimensional (3D) memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

During a programming operation, the memory cells are programmed according to a word line programming order. For example, the programming may start at the word line at the source side of the block and proceed to the word line at the drain end of the block. As another example, the programming may start at the word line at the drain end of the block and proceed to the word line at the source side of the block. Herein, the phrase "programming a word line" means to program non-volatile memory cells that are connected to the word line. In one approach, each word line is programmed before programming a physically adjacent word line. The word lines may be referred to with numbers based on their physical location. For example, word line zero (WL0) may be closest to one end of a block of memory cells, with WL1 next to WL0, etc. In one possible word line programming order, a first word line, WL0, is programmed, then a second word line, WL1, is programmed and so forth until the last word line in the block is programmed. A program operation may use a set of increasing program voltages that are applied to the word line in respective program loops or program-verify iterations. The memory cells may also be programmed according to a sub-block programming order, where memory cells connected to a word line are programmed in one sub-block, then a next sub-block and so forth.

Herein, the phrase "programming a set of word lines" means to program first non-volatile memory cells connected to a first word line in the set, program second non-volatile memory cells connected to a second word line in the set, etc. Herein, the phrase "programming a set of word lines in sequential order" means that one word line is programmed at a time with the order of programming proceeding from one word line to the immediate neighbor in the same direction. For example, the word lines could be programmed sequentially from WL0 to WL95. For example, the sequential order could be WL0, WL1, WL2, . . . WL94, WL95. The sequential order is not required to start with the lowest or highest numbered word line in the set. For example, a sequential order could be WL16, WL17, . . . WL95, WL0, WL1, . . . WL15.

Each memory cell may be associated with a data state according to write data in a program command. In one embodiment, based on its data state, a memory cell will either remain in the erased state or be programmed to a programmed data state. For example, in a single bit per cell storage device, also referred to as SLC, or single level cell, there are two data states including the erased state and the programmed state. MLC or multi-level cells store two or more bits per cell, as a multiple bit memory cell. For example, in a two-bit per cell storage device, there are four data states including the erased state and three data states. In a three-bit per cell storage device, there are eight data states including the erased state and seven data states.

In some embodiments, a multi-phase programming technique is used in which the program operation includes multiple phases. One example of a multi-phase programming technique is when one bit is programmed into each memory cell each phase. In some embodiments, a first programming phase is performed on memory cells connected to a word line, after which the first programming phase is performed on memory cells connected to an adjacent word line, after which a second programming phase is performed on memory cells connected to the first word line, after which the second programming phase is performed on memory cells connected to the second word line. Note that the first programming phase may be performed on still another word line prior to performing the second programming phase on the second word line. Herein, such multi-phase programming techniques are considered to follow a sequential word line programming order. In multi-phase programming techniques, the phase in which programming is complete is referred to as the final phase.

Technology is disclosed herein for changing the order of programming. In some embodiments, the order in which a set of word lines are programmed is changed over time. For example, initially a set of word lines in a block or sub-block may be programmed in one order. At some point, the program order may be changed. In some embodiments, the program order in one memory block is different from another memory block. The first and second memory blocks could be on the same memory die or on two different memory dies.

In some embodiments, the order in which a set of word lines are programmed is reversed over time. For example, initially a set of word lines in a block or sub-block may be programmed sequentially in a direction from the source end of the block (or sub-block) to the drain end of the block (or sub-block). At some point, the program order may be reversed such that the set of word lines may be programmed sequentially in a direction from the drain end of the block (or sub-block) to the source end of the block (or sub-block). In some embodiments, the program order in one block is different (e.g., the reverse) from another block. For example, a first block may be programmed sequentially in an order from the source end of the block to the drain end of the block, and a second block may be programmed in a direction from the drain end of the block to the source end of the block. The first and second blocks could be on the same memory die or on two different memory dies.

Changing (e.g., reversing) the order of programming a set of word lines can improve error recovery. In some cases, when programming a set of word lines, it can be beneficial for error recovery to have a problem word line programmed early within the set. An example of a problem word line is one for which programming may be more likely to fail than other word lines. In one embodiment, the order of programming a set of word lines is changed (e.g., reversing) to place a problem word line earlier in the order. In other cases, when programming a set of word lines, it can be beneficial for error recovery to have a problem word line programmed later in the order. In one embodiment, the order of programming a set of word lines is changed (e.g., reversing) to place a problem word line later in the order. Whether it is preferable to have the problem word line earlier or later in the programming order may depend on error recovery techniques in use.

Using a different programming order for one set of word lines relative to the order in which another set of word lines is programmed can improve error recovery. In one embodiment, half of a set of memory die have word lines programmed in one order, with the other half being programmed in a different order. For example, half of a set of memory die have word lines programmed in one sequential order, with the other half being programmed in a reverse of that sequential order. Using a different programming order (e.g., reverse) for different sets of word lines can help to improve error recovery if, for example, redundancy data is created based on the order in which word lines were programmed in the memory die. For example, a spare memory die may be used to store the redundancy data, which may be formed from a bitwise Exclusive OR (XOR) of data from the other memory die. A set of word lines (one word line from each die) that have their data XORed may be referred to as a stripe. The redundancy data may be able to recover from a situation in which the data on one memory die cannot be read due to, for example, a defective word line. With some error recovery techniques, however, if there are two memory die for which the data cannot be read, then the redundancy data will not be able to recover the data. Using different programming orders may place problem word lines into different stripes, which may decrease the chance of an un-recoverable error due to two problem word lines being in the same stripe.

FIG. 1A is a block diagram of one embodiment of a storage device connected to a host. Storage device 100 can implement the technology proposed herein for reversing the sequential programming order. Many different types of storage devices can be used with the technology proposed herein. One example storage device is a solid state device (SSD); however, other types of storage devices can also be used. Storage device 100 comprises a controller 102, non-volatile memory 104 for storing data, and local memory (e.g. DRAM/ReRAM) 106. In one embodiment, local memory 106 is optional. Controller 102 comprises a front end processor circuit (FEP) 110 and one or more back end processor circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the controller 102 is manufactured as a System on a Chip (SoC). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction, control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with storage device 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from storage device 100. In one embodiment, storage device 100 is embedded in host 120.

Figure 1B:
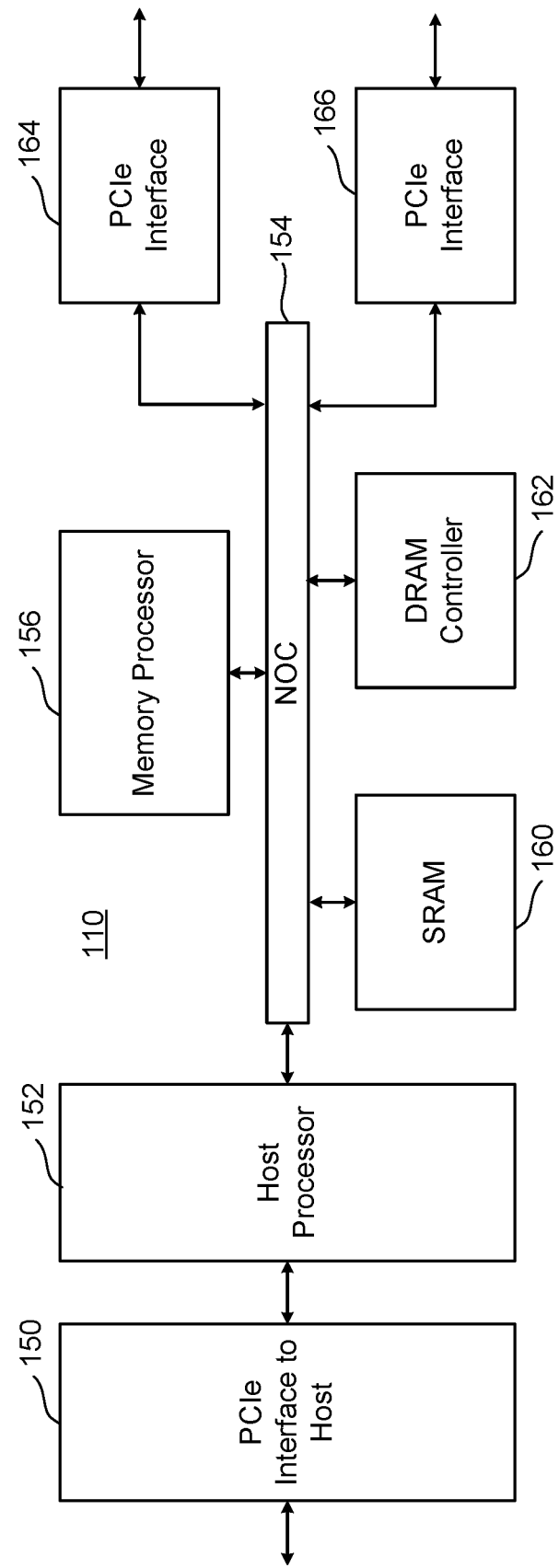
FIG. 1B is a block diagram of one embodiment of a front end processor circuit. In some embodiments, the front end processor circuit is part of a controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 1C:
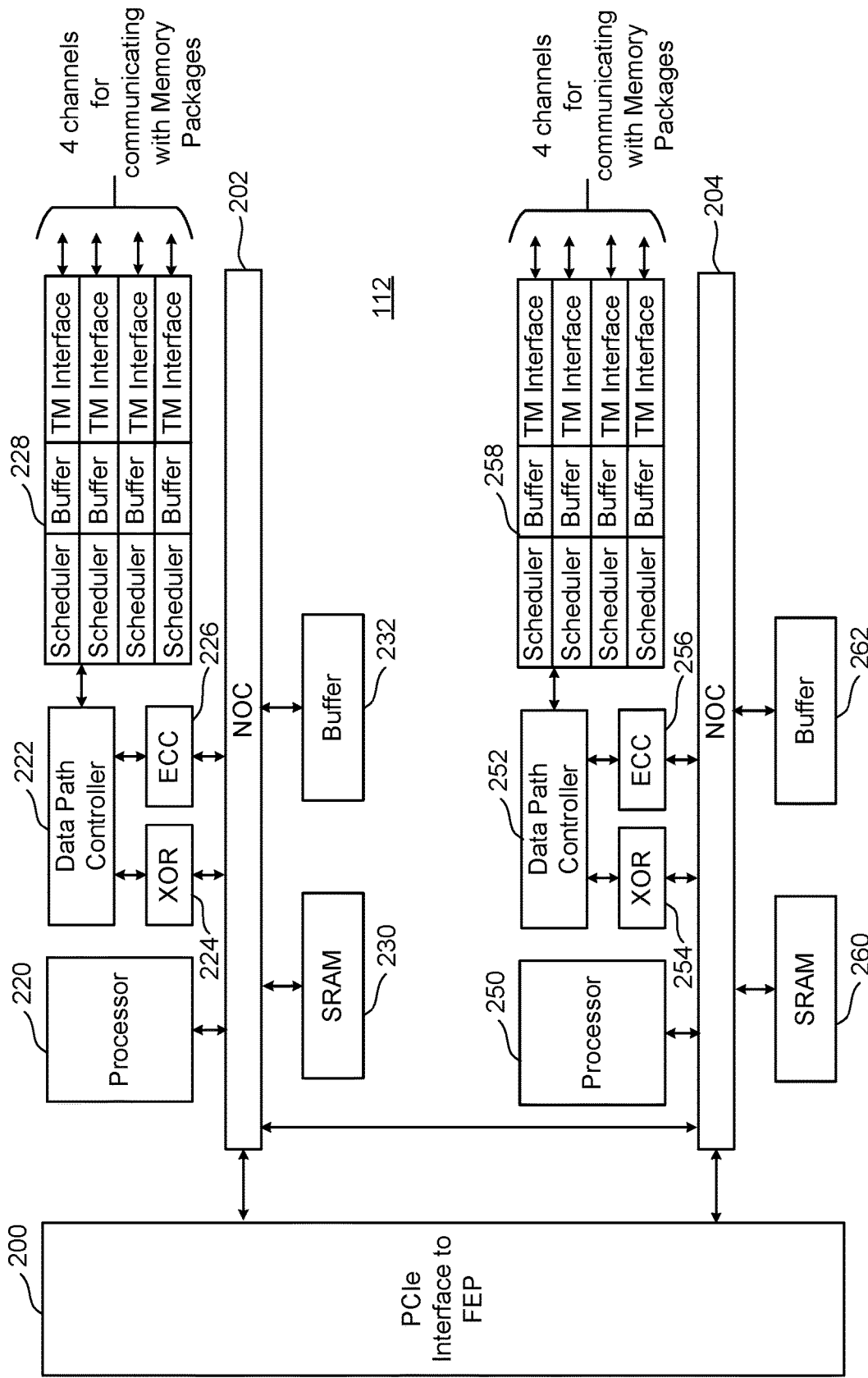
FIG. 1C is a block diagram of one embodiment of a back end processor circuit. In some embodiments, the back end processor circuit is part of a controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs (Network-on-a-Chip) 202 and 204. In one embodiment, the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a UECC failure. In one embodiment, XOR engines 224/254 form a bitwise XOR of different pages of data. The XOR result may be stored in a memory package 104. In the event that an ECC engine 226/256 is unable to successfully correct all errors in a page of data that is read back from a memory package 104, the stored XOR result may be accessed from the memory package 104. The page of data may then be recovered based on the stored XOR result, along with the other pages of data that were used to form the XOR result.

Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Interfaces 228/258, alone or in combination, may be referred to as a memory interface configured to be connected to non-volatile memory (e.g., memory package 104). A combination of one or more of processor 220/250, data path controller 222/252, XOR 224/254, ECC 226/256 may be referred to herein as a processor circuit. The buffer 232/262, SRAM 230/260, and/or NOCs 202/204 may also be considered to be a part of the processor circuit.

Figure 1D:
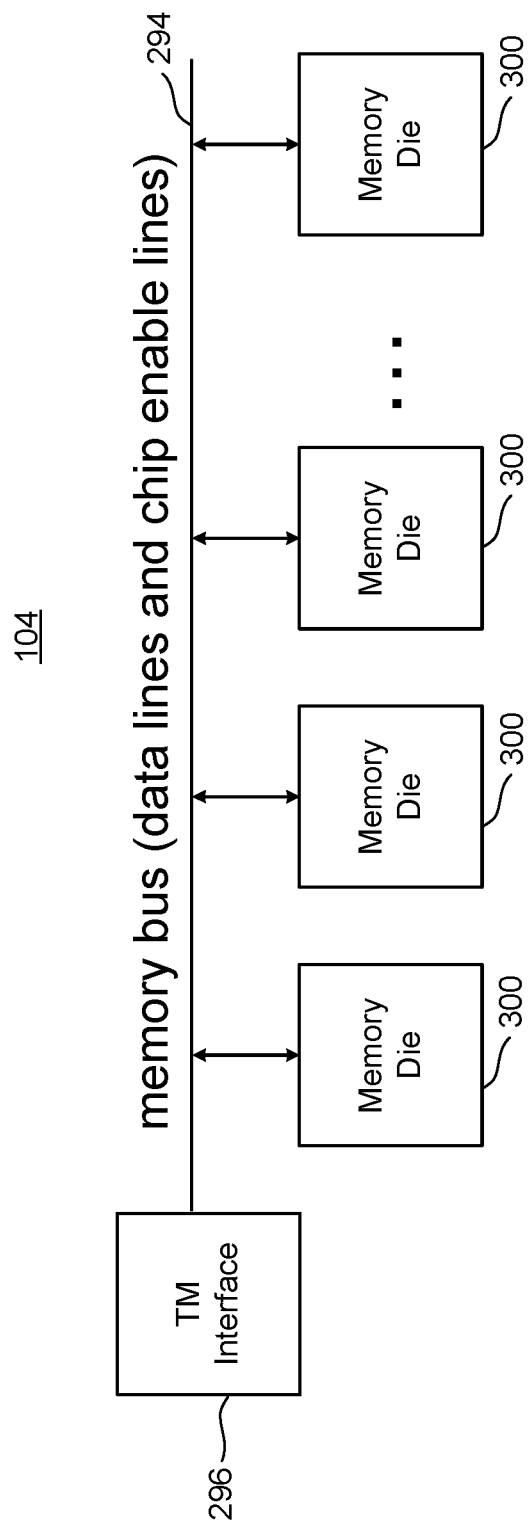
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2:
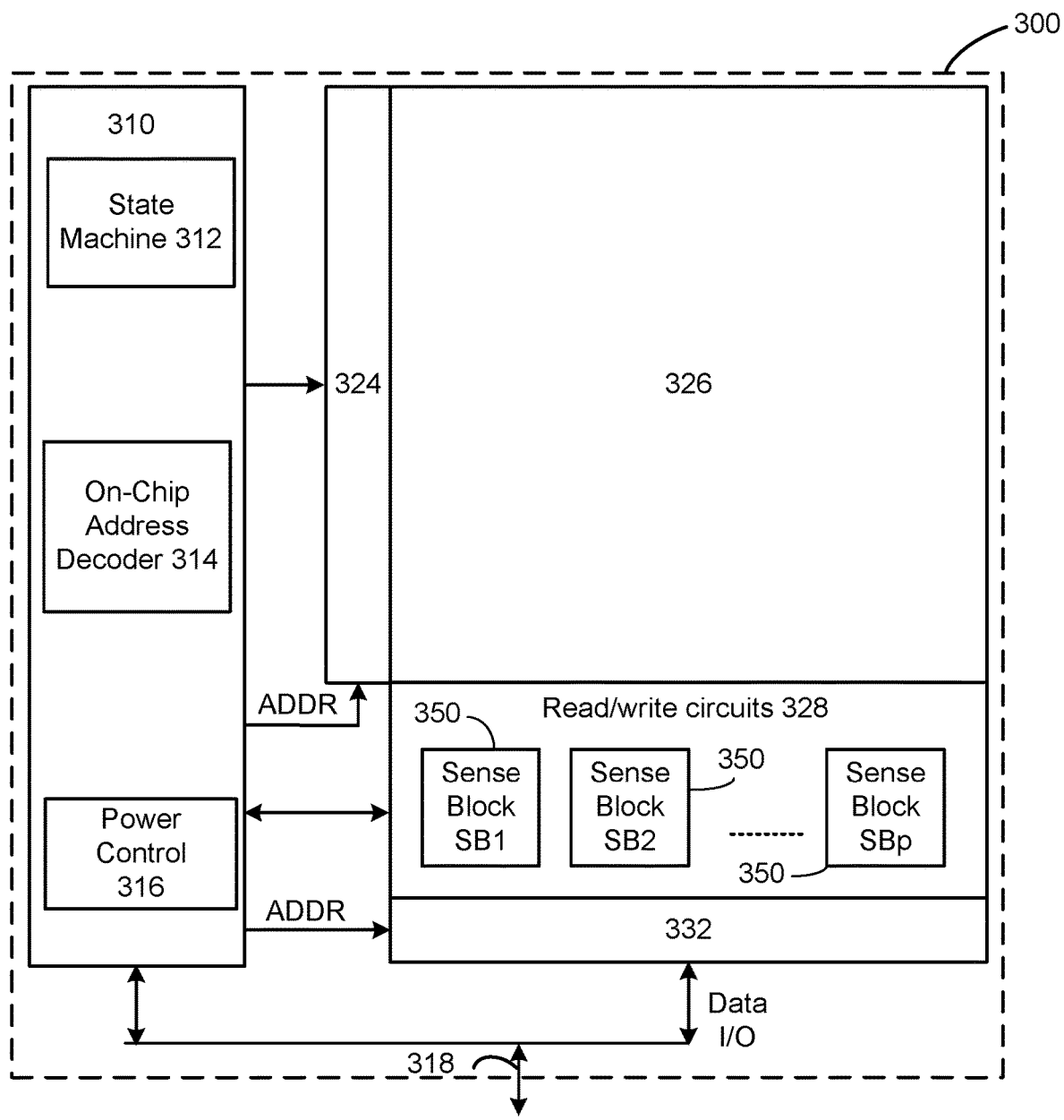
FIG. 2 is a block diagram of one embodiment of a memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes control circuitry 310, a memory structure 326, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface and an Open NAND Flash Interface (ONFI). Other I/O interfaces can also be used.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, and a power control module 316. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102 (or other controller), which is an electrical circuit in combination with software (e.g., firmware), that performs the functions described below in the flow charts. In one embodiment, the control circuit is the controller where the controller is an electrical circuit that does not use hardware. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate the non-volatile memory.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
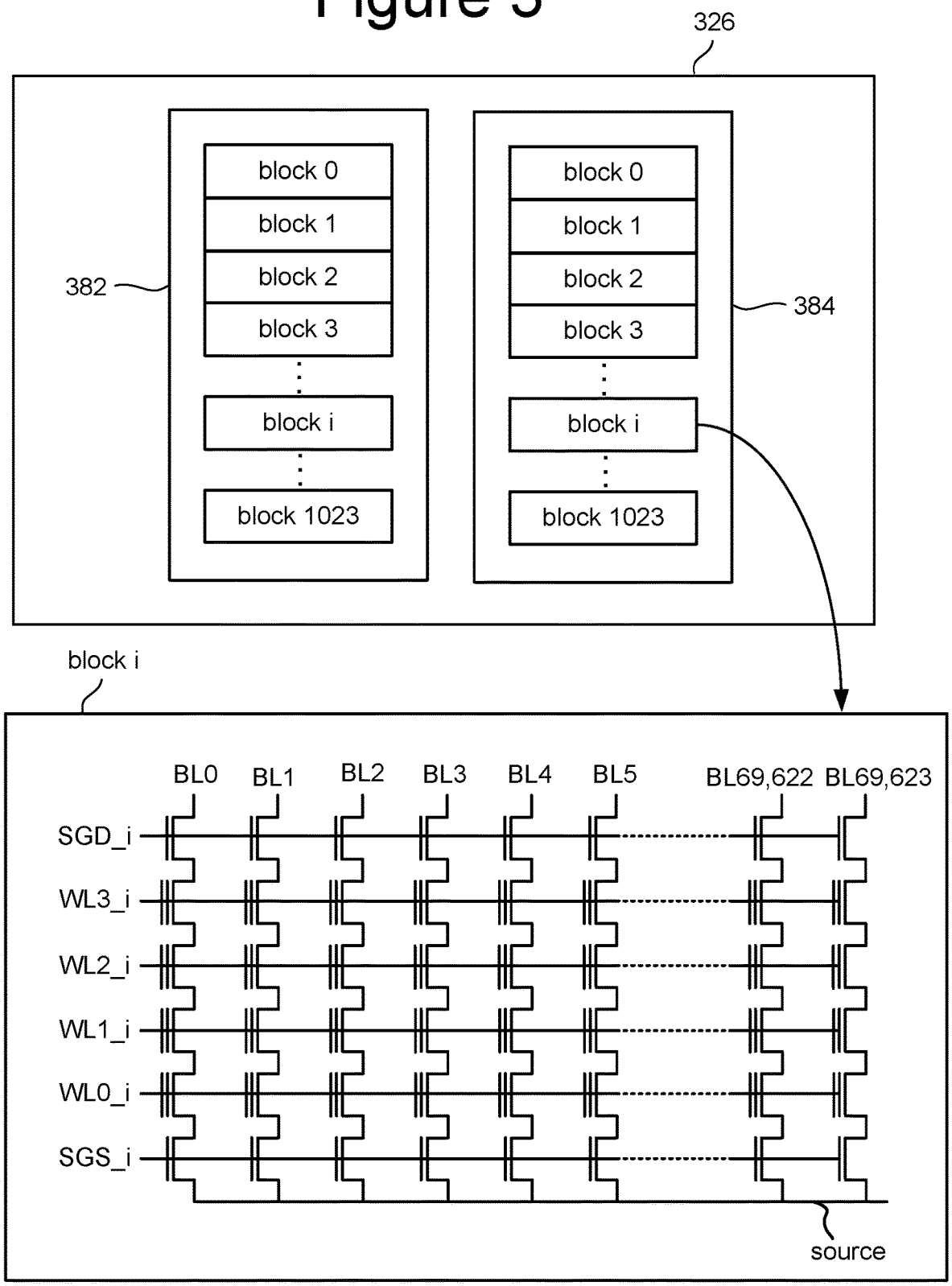
FIG. 3 is a block diagram that depicts details of a non-volatile memory structure.

FIG. 3 depicts an example of memory structure 326. In one embodiment, memory structure 326 is an array of memory cells divided into multiple planes. In FIG. 3, memory structure 326 is divided into two planes: plane 382 and plane 384. In other embodiments, more or fewer than two planes can be used. In some embodiments, each plane is divided into a number of memory erase blocks (e.g., blocks 0-1023, or another amount). In certain memory technologies (e.g. 2D/3D NAND and other types of flash memory), a memory erase block (or "memory block" or "block") is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 326. As used herein, a memory erase block is a contiguous set of memory cells that share word lines and bit lines; for example, erase block i of FIG. 3 includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 3 shows four memory cells connected in series to form a NAND string. Although four cells are depicted to be included in each NAND string, more or fewer than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 3 shows 69,624 bit lines, a different number of bit lines can also be used.

Each memory erase block and/or each memory unit is typically divided into a number of pages. In one embodiment, a page is a unit of programming and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the page. The controller 102 (or other component) calculates the ECC when data is being written into the array, and also checks it when data is being read from the array. In one embodiment, a page includes data stored in all memory cells connected to a common word line.

The term meta-block is used to refer to a logical construct that comprises multiple physical blocks. For example, a meta-block may be formed from one or more physical blocks from each of a number of memory die. In some cases, the meta-block includes a single physical block from each of a number of memory die. In some cases, the meta-block can include more than one physical block on a single memory die, such as when the meta-block includes a physical block for each plane on a memory die.

A page of data stored in the memory cells connected to a common word line is referred to as a physical page. In some embodiments, data is programmed in a unit of a meta-page. A meta-page is a logical construct that comprises multiple physical pages. For example, a meta-page may be formed from one or more physical pages on each of a number of memory dies. In some cases, the meta-page includes a single physical page from each of a number of memory die. In some cases, the meta-page may include more than one physical page on a single memory die, such as when the meta-page includes a physical page for each plane on a memory die. A meta-page comprises all physical pages across a meta-block that can be read and programmed concurrently.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

Figure 4:
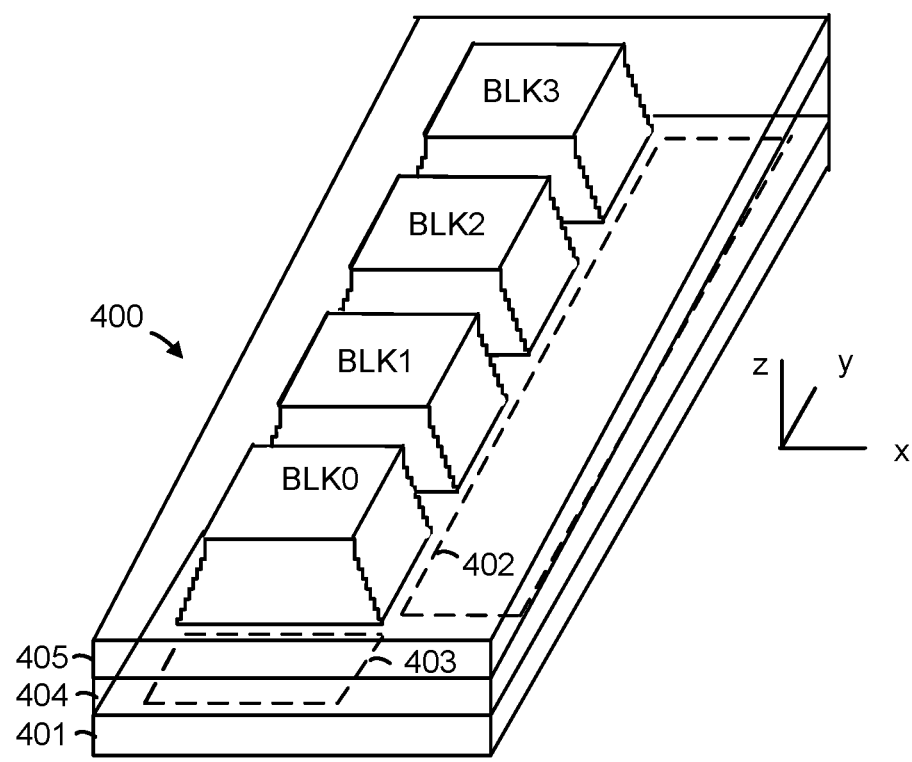
FIG. 4 is a perspective view of a storage device comprising a set of blocks in an example 3D configuration of the memory structure 326 of FIG. 2.

FIG. 4 is a perspective view of a storage device 400 comprising a set of blocks in an example 3D configuration of the memory structure 326 of FIG. 2. On the substrate 401 are example blocks BLK0, BLK1, BLK2 and BLK3 of memory cells (storage elements) and peripheral areas with circuitry for use by the blocks. The peripheral area 402 runs along an edge of each block while the peripheral area 403 is at an end of the set of blocks. The circuitry can include voltage drivers which can be connected to control gate layers, bit lines and source lines of the blocks. In one approach, control gate layers at a common height in the blocks are commonly driven. The substrate 401 can also carry circuitry under the blocks, and one or more lower metal layers which are patterned in conductive paths to carry signals of the circuitry. The blocks are formed in an intermediate region 404 of the storage device. In an upper region 405 of the storage device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the storage device. The blocks could also be arranged in multiple planes.

Figure 5A:
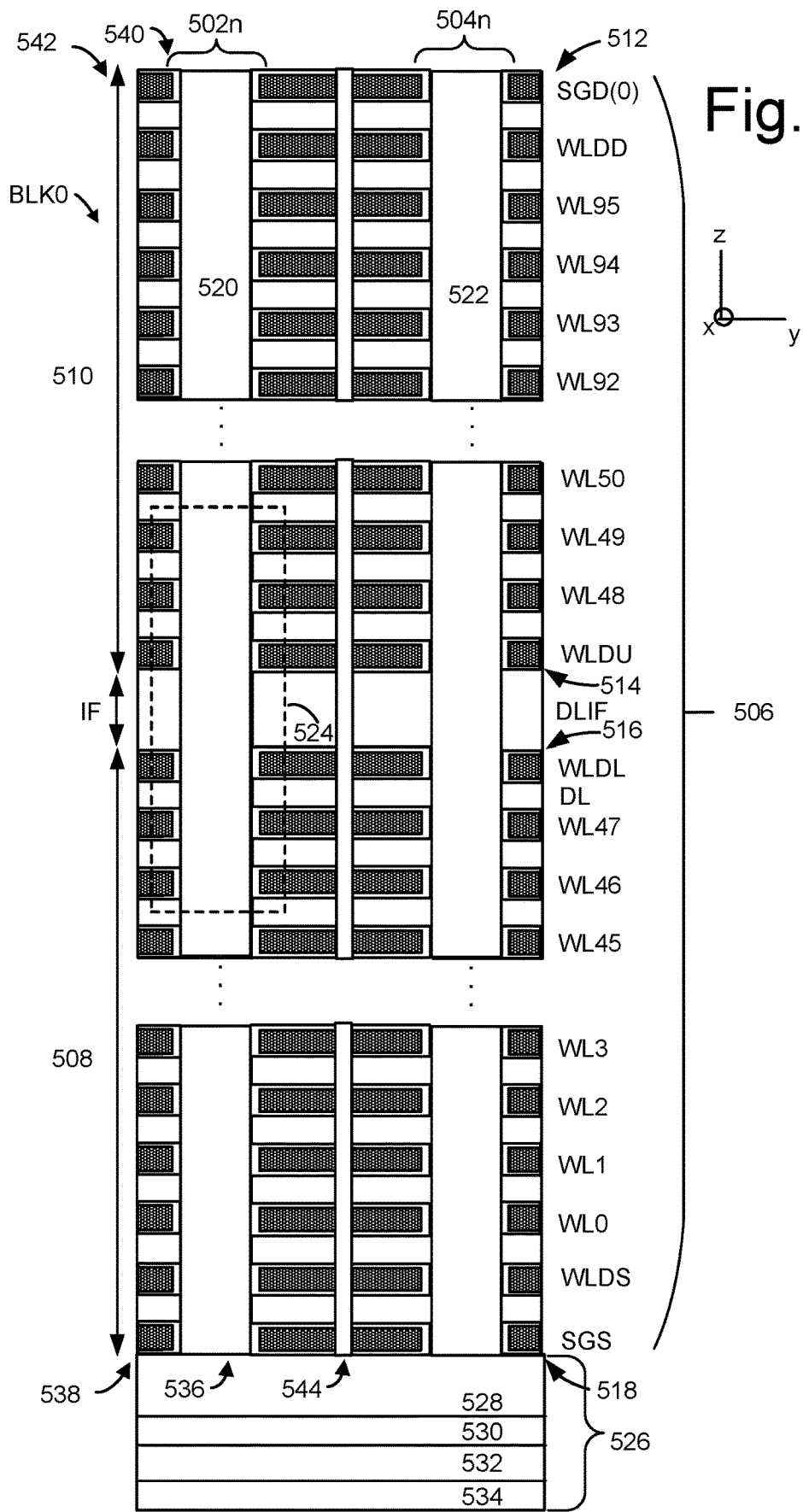
FIG. 5A depicts an example cross-sectional view of a portion of BLK0 of FIG. 4, including multiple tiers.

FIG. 5A depicts an example cross-sectional view of a portion of BLK0 of FIG. 4, including NAND strings 502n and 504n. The block comprises a stack 506 of alternating conductive and dielectric layers in two tiers including a lower tier 508 (e.g., a first tier or a bottom tier) and an upper tier 510 (e.g., a second tier or a top tier). The tiers are separated by an interface (IF) (or interface region or junction) which is formed of dielectric material. The conductive layers comprise SGS, WLDS, WL0-WL47, WLDL, WLDU, WL48-WL95, WLDD and SGD(0). WLDS, WLDL, WLDU and WLDD are dummy word lines or conductive layers connected to dummy memory cells which are ineligible to store user data, WL0-WL47 are data word lines or conductive layers in the lower tier connected to data memory cells which are eligible to store user data, and WL48-WL95 are data word lines in the upper tier. As an example only, the stack includes 96 data word lines, and the data word lines are evenly divided between the two tiers. DL is an example dielectric layer outside the interface, and DLIF is a dielectric layer of the interface.

A top (or drain end) 512 of the upper tier and the stack is depicted along with a bottom (or source end) 514 of the upper tier, a top (or drain end) 516 of the lower tier and a bottom (or source end) 518 of the lower tier and the stack. Each tier has a drain end and a source end that are defined relative to the drain end and the source end of the NAND strings.

WLDL and WLDU are examples of unselected word lines adjacent to the interface, and WL0-WL47 and WL48-WL95 are examples of unselected word lines non-adjacent to the interface in the lower and upper tiers, respectively.

The NAND strings each comprise a memory hole 520 or 522, respectively, which is filled with materials which form memory cells adjacent to the word lines. For example, see region 524 of the stack which is shown in greater detail in FIG. 6. The memory holes may also be referred to herein as pillars.

The stack is formed on a substrate 526. In one approach, a well region 528 is an n-type source diffusion layer or well in the substrate. The well region is in contact with a source end of each string of memory cells in a block. The n-type well region 528 in turn is formed in a p-type well region 530, which in turn is formed in an n-type well region 532, which in turn is formed in a p-type semiconductor substrate 534, in one possible implementation. The n-type source diffusion layer may be shared by all of the blocks in a plane, in one approach, and form a source line SL which provides a voltage to a source end of each NAND string.

The NAND string 502n has a source end 536 at a bottom 538 of the stack 506 and a drain end 540 at a top 542 of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 544 separates the block into sub-blocks, where the NAND strings 502n and 504n are in different sub-blocks.

Figure 5B:
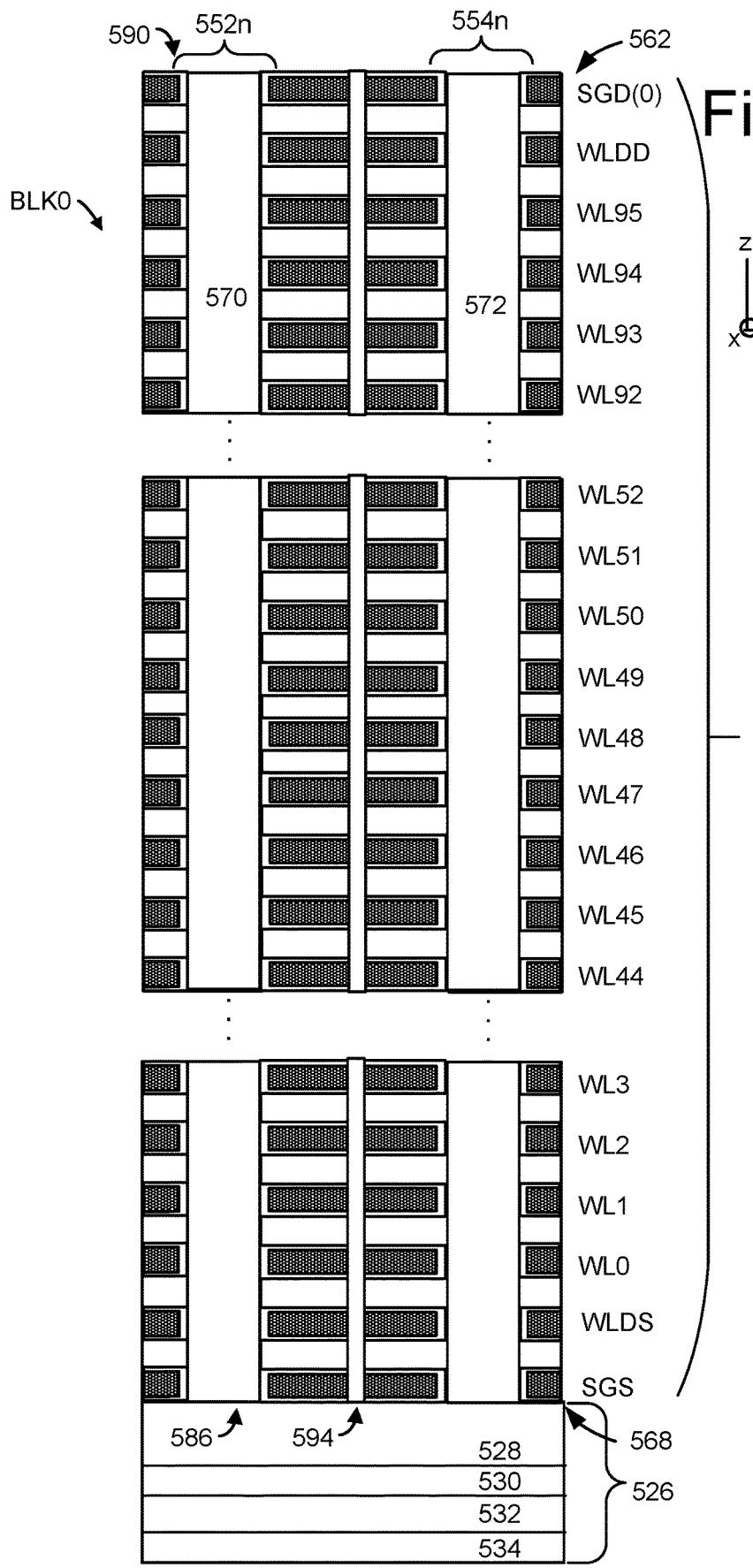
FIG. 5B depicts an example cross-sectional view of a portion of BLK0 of FIG. 4, including a single tier.

FIG. 5A depicts a portion of a block for an embodiment in which the block has multiple tiers. It is not required that the block have multiple tiers. FIG. 5B depicts a portion of a block for an embodiment in which the block has a single tier. FIG. 5B depicts two NAND strings 552n and 554n. The block comprises a stack 556 of alternating conductive and dielectric layers. The conductive layers comprise SGS, WLDS, WL0-WL95, WLDD and SGD(0).

A top (or drain end) 562 of the stack is depicted along with a bottom (or source end) 568 of the stack. In this embodiment, the stack may be considered to be a single tier in which the single tier has a drain end 562 and a source end 568 that are defined relative to the drain end and the source end of the NAND strings.

The NAND strings each comprise a memory hole 570 or 572, respectively, which is filled with materials which form memory cells adjacent to the word lines.

The NAND string 552n has a source end 586 at a bottom 568 of the stack 556 and a drain end 590 at a top 562 of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

An insulation-filled region 594 separates the block into sub-blocks, where the NAND strings 552n and 554n are in different sub-blocks.

Figure 6:
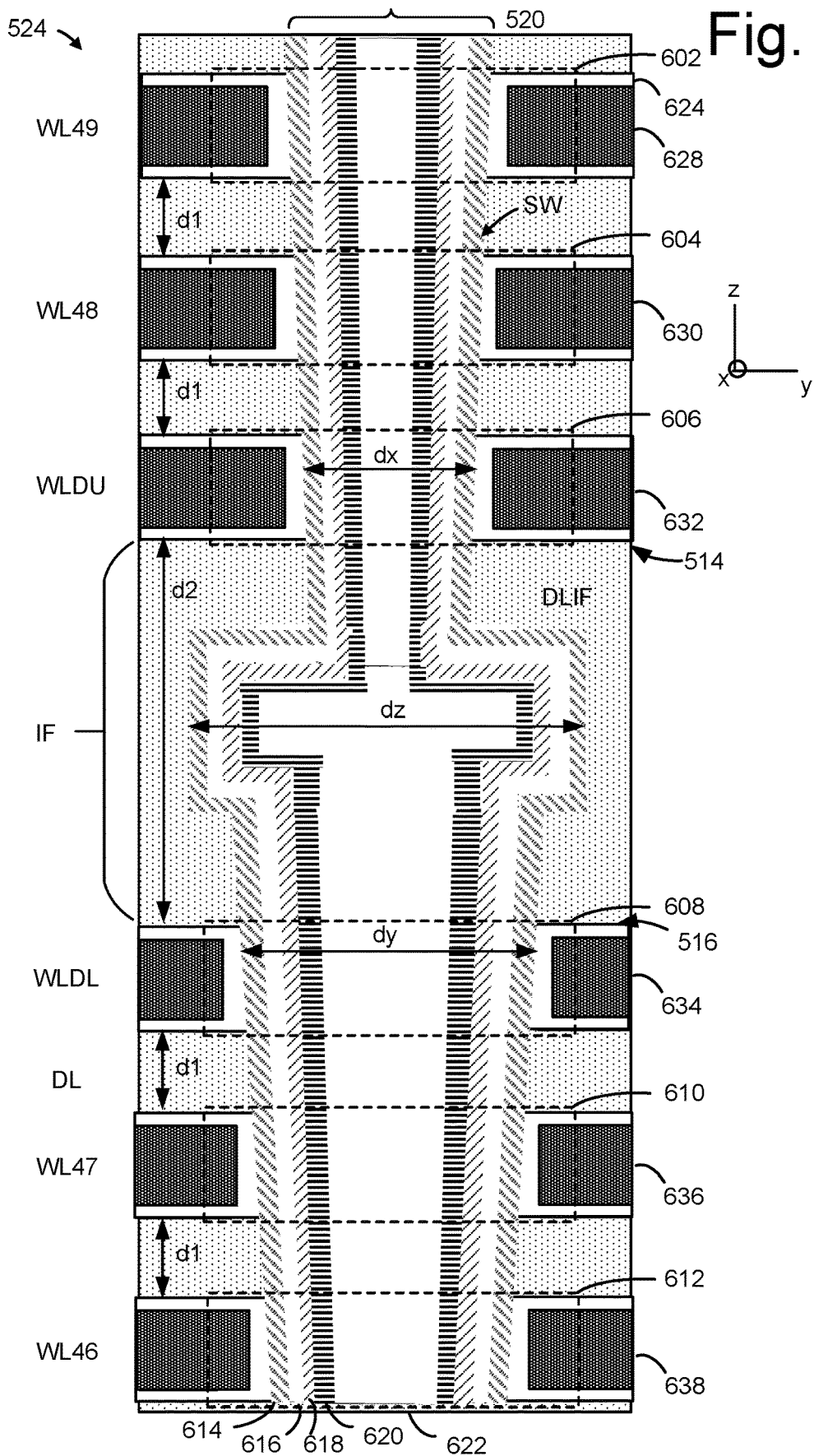
FIG. 6 depicts a close-up view of the region 524 of the stack of FIG. 5A.

FIG. 6 depicts a close-up view of the region 524 of the stack of FIG. 5A. The region includes the three word lines below the interface, WL46, WL47 and WLDL, and the three word lines above the interface, WLDU, WL48 and WL49. Generally, the NAND string comprises memory cells connected to respective word lines. This example includes memory cells 602, 604, 606, 608, 610 and 612 connected to word lines WL49, WL48, WLDU, WLDL, WL47 and WL46, respectively. The word lines or word line layers are spaced apart by dielectric layers, which each have a thickness or height of d1 (a first distance) outside the interface, and by DLIF, which has a larger thickness or height of d2 (a second distance) in the interface. D1 and d2 are also inter-cell distances, or distances between adjacent memory cells along the z or vertical axis. In one approach, d2 is at least 1.5-4 times the height of d1. DLIF can be an aggregated layer which is made up of dielectric materials which are deposited in one or more separate layers on top of one another. The thickness or height of d2 of the interface is greater than a height of dielectric layers between the data memory cells.

The memory cell 606 is connected to WLDU, and is adjacent to and above the interface. The memory cell 608 is connected to WLDL, and is adjacent to and below the interface. These are interface memory cells. The second distance spans the interface. In some cases, the memory cells 606 and 608 can be set as dummy memory cells which are ineligible to store user data, due to the difficulty in controlling the channel region along the interface. WLDU and WLDL are dummy word lines in this case.

The memory hole which is etched through each tier of the stack has a tapered shape, e.g., wider at the top and narrower at the bottom. As a result, the memory hole diameter dy at the top word line layer or memory cell in the lower tier is larger than the memory hole diameter dx at the bottom word line layer or memory cell in the upper tier. A diameter dz represents a widest region of the memory hole. This widened region is used to accommodate small misalignments in the memory hole portion of the upper tier relative to the memory hole portion in the lower tier. The increased thickness d2 of DLIF is provided due to process margin concerns and also accommodates misalignment by providing a transition region between the memory hole portions in the two tiers. The diameter of the memory hole thus changes abruptly partway along a height of the memory hole.

A number of layers or films can be deposited along the sidewall of the memory hole. The layers can conform to the changing diameter in the interface. For example, the layers can include a blocking oxide/block high-k material 614, a charge-trapping layer 616 (e.g., silicon nitride ($Si_3N_4$) or other nitride), a tunneling layer 618 (e.g., oxide) and a channel 620 layer (e.g., polysilicon). A dielectric core 622 (e.g., silicon dioxide) fills a remainder of the memory hole. A pillar 520 or column can be formed by the materials within a memory hole as an active area of a NAND string. Referring to WL49 as an example, a word line layer can include a metal barrier 624, and a conductive metal as a control gate. For example, control gates 628, 630, 632, 634, 636 and 638 are provided. The NAND string can be considered to have a floating body channel because the length of the channel is not formed on a substrate. When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Figure 7:
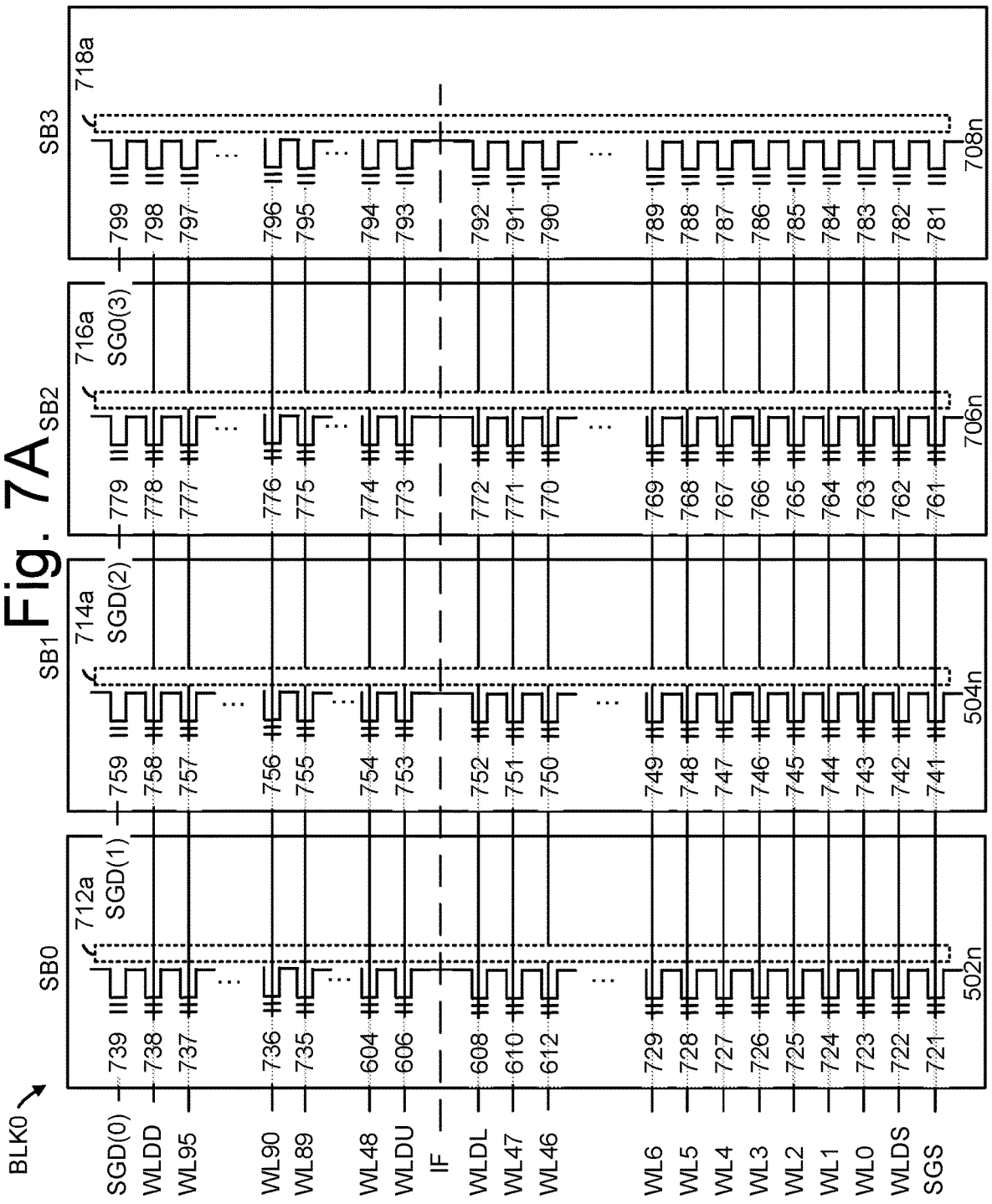
FIG. 7A depicts an example view of NAND strings in sub-blocks in a 3D configuration which is consistent with the two-tier stack of FIG. 5A.
FIG. 7B depicts an example transistor which represents any of the memory cells or select gate transistors of FIG. 7A.

FIG. 7A depicts an example view of NAND strings in sub-blocks in a 3D configuration which is consistent with the two-tier stack of FIG. 5A. Each sub-block includes multiple NAND strings or other sets of memory cells connected to one another, where one example NAND string is depicted for each sub-block. The memory cells in a set may be connected to one another serially. For example, SB0, SB1, SB2 and SB3 comprise example NAND strings 502n, 504n, 706n and 708n, respectively. In this example, each NAND string has one SGD transistor, one drain-side dummy memory cell, 96 data memory cells (where 48 are above the interface IF, i.e., connected to WL48-WL95, and 48 are below the interface, i.e., connected to WL0-WL47), one source-side dummy memory cell and one SGS transistor.

In the block BLK0, each sub-block comprises a set of NAND strings which extend in the x direction and which have a common SGD line. The NAND strings 502n, 504n, 706n and 708n are in sub-blocks SB0, SB1, SB2 and SB3, respectively. Programming of the block may occur one sub-block at a time. Within each sub-block, a sequential word line programming order may be followed. For example, the word lines could be programmed one word line at a time from the source end to the drain end, or alternatively from the drain end to the source end. In some embodiments, a multi-phase programming technique is used in which a first programming phase is performed on memory cells connected to a first word line, after which the first programming phase is performed on memory cells connected to a second (adjacent) word line, after which a second programming phase is performed on memory cells connected to the first word line, after which the second programming phase is performed on memory cells connected to the second word line. Note that the first programming phase may be performed on still another word line prior to performing the second programming phase on the second word line. Herein such multi-phase programming techniques are considered to follow a sequential word line programming order. In multi-phase programming techniques, the phase in which programming is complete is referred to as the final phase.

The different sub-blocks may be programmed in the same word line programming order, or different word line programming orders. For example, a first set of one or more of the sub-blocks could be programmed sequentially from source side to the drain end and a second set of one or more of the sub-blocks could be programmed sequentially from drain end to the source side. The upper tier and the lower tier of a sub-block may share the same sequential word line programming order, or have different sequential word line programming orders. For example, the upper tier of a sub-block could be programmed sequentially from WL48 to WL95, and the lower tier of a sub-block could be programmed sequentially from WL47 to WL0.

The NAND strings 502n, 504n, 706n and 708n have channels 712a, 714a, 716a and 718a, respectively. Each channel can extend continuously from a source end select gate transistor to a drain end select gate transistor.

NAND string 502n includes SGS transistor 721, source-side dummy memory cell 722 connected to WLDS, lower tier data memory cells 723, 724, 725, 726, 727, 728, 729, . . . 612, 610 connected to WL0-WL47, interface-adjacent dummy memory cells 608 and 606 connected to WLDL and WLDU, respectively, upper tier data memory cells 604, . . . 735, 736, . . . , 737 connected to WL48-WL95, drain-side dummy memory cell 738 connected to WLDD, and SGD transistor 739 connected to SGD(0).

Similarly, NAND string 504n includes SGS transistor 741, source-side dummy memory cell 742 connected to WLDS, lower tier data memory cells 743, 744, 745, 746, 747, 748, 749, . . . 750, 751 connected to WL0-WL47, interface-adjacent dummy memory cells 752 and 753 connected to WLDL and WLDU, respectively, upper tier data memory cells 754, . . . 755, 756, . . . 757 connected to WL48-WL95, drain-side dummy memory cell 758 connected to WLDD, and SGD transistor 759 connected to SGD(1).

NAND string 706n includes SGS transistor 761, source-side dummy memory cell 762 connected to WLDS, lower tier data memory cells 763, 764, 765, 766, 767, 768, 769, . . . 770, 771 connected to WL0-WL47, interface-adjacent dummy memory cells 772 and 773 connected to WLDL and WLDU, respectively, upper tier data memory cells 774, . . . 775, 776, . . . 777 connected to WL48-WL95, drain-side dummy memory cell 778 connected to WLDD, and SGD transistor 779 connected to SGD(2).

NAND string 708n includes SGS transistor 781, source-side dummy memory cell 782 connected to WLDS, lower tier data memory cells 783, 784, 785, 786, 787, 788, 789, . . . 790, 791 connected to WL0-WL47, interface-adjacent dummy memory cells 792 and 793 connected to WLDL and WLDU, respectively, upper tier data memory cells 794, . . . 795, 796, . . . 797 connected to WL48-WL95, drain-side dummy memory cell 798 connected to WLDD, and SGD transistor 799 connected to SGD(3).

In this example, the dummy memory cells 606, 753, 773 and 793 are adjacent to and above the interface, and the dummy memory cells 608, 752, 772 and 792 are adjacent to and below the interface.

A selected sub-block is a sub-block which contains the selected memory cells being read or programmed. As mentioned, for a given word line, the memory cells in one sub-block can be read in a read operation. An unselected sub-block is a sub-block which does not contains the selected memory cells being read or programmed. For example, in FIG. 7A, if SB0 is the selected sub-block, then SB1-SB3 are unselected sub-blocks. If WLn=WL_sel=WL5, memory cell 728 and other memory cells connected to WL5 in SB0 are selected memory cells. Memory cells 748, 768 and 788 and other memory cells connected to WL5 in SB1, SB2 and SB3, respectively, are examples of unselected memory cells. Also in this example, memory cells 729, 749, 769 and 789 and other memory cells connected to WLn+1=WL6 in SB0, SB1, SB2 and SB3, respectively, are examples of unselected memory cells, and memory cells 727, 747, 767 and 787 and other memory cells connected to WLn−1=WL4 in SB0, SB1, SB2 and SB3, respectively, are examples of unselected memory cells.

FIG. 7B depicts an example transistor 800 which represents any of the memory cells or select gate transistors of FIG. 7A. The transistor comprises a control gate CG, a drain D, a source S and a channel CH and may represent a memory cell or a select gate transistor, for example.

Figure 8:
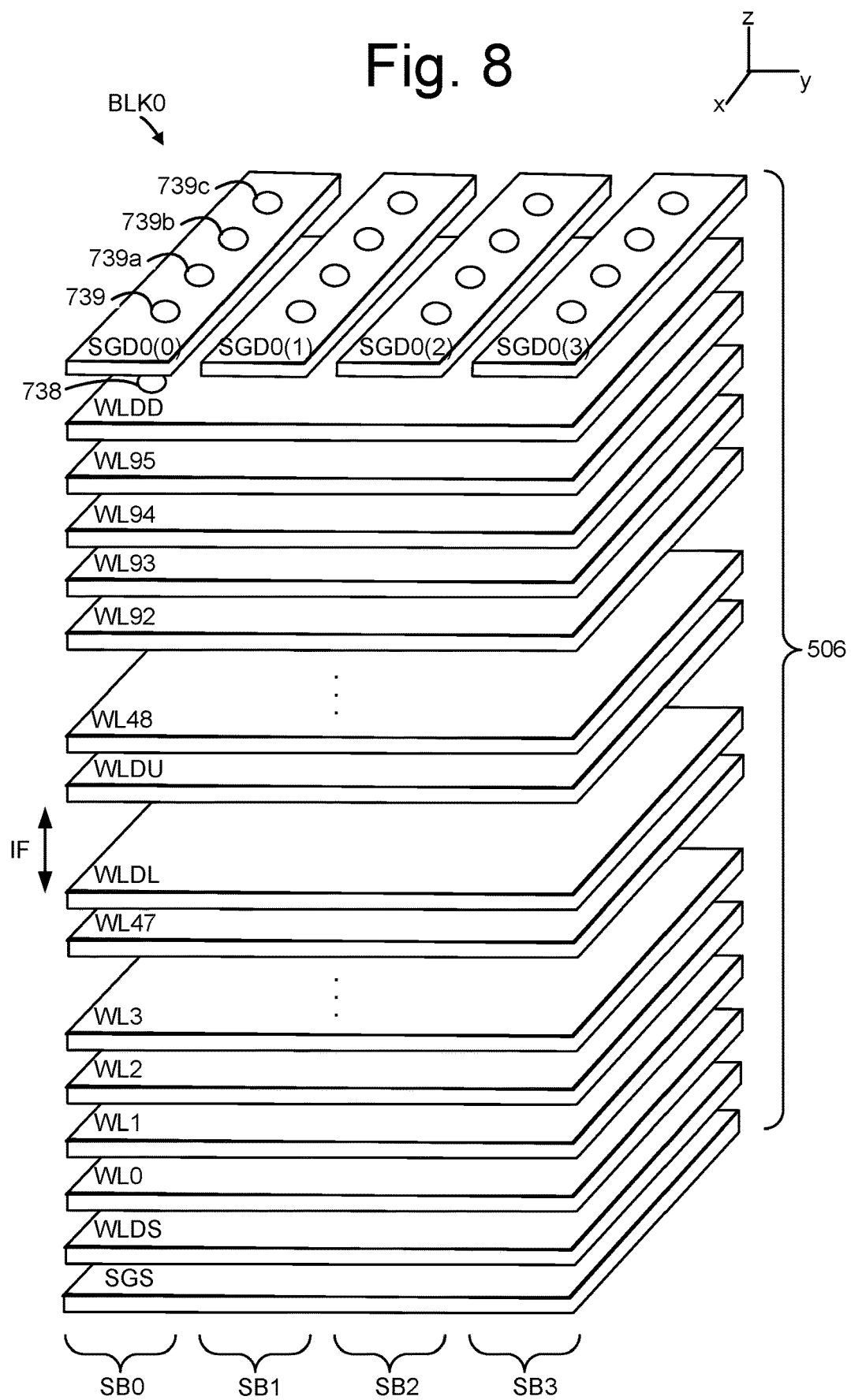
FIG. 8 depicts control gate layers in BLK0 consistent with FIGS. 5A and 6-7A.

FIG. 8 depicts control gate layers in BLK0 consistent with FIGS. 5A and 6-7A. The control gate layers are arranged in the stack 506 and include the layers SGS, WLDS, WL0-WL47, WLDL, WLDU, WL48-WL95, WLDD and SGD (0)-SGD(3). The SGS control gate layer is common for the block. Optionally, a separate SGS control gate layer could be provided for each sub-block. Additionally, four example memory holes are depicted in each sub-block. As mentioned, select gate transistors and memory cells can be formed along each memory hole in a NAND string. For example, SGD transistors 739, 739a, 739b and 739c are depicted in SGD0 (0), and a dummy memory cell 738 is depicted in WLDD.

Figure 9A:
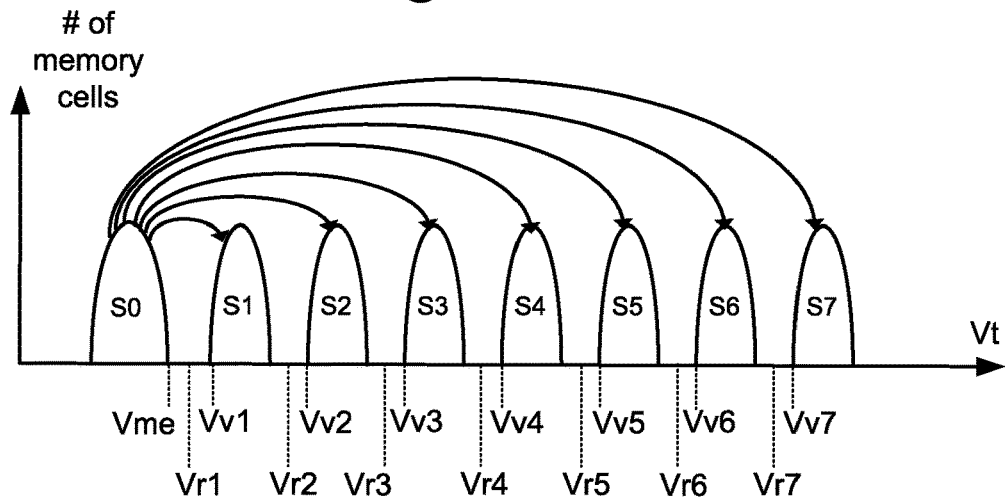
FIG. 9A is a graph of number of memory cells versus threshold voltage in which memory cells each store three bits.

The memory systems discussed herein can be erased, programmed and read. At the end of a successful programming process (with verification), the threshold voltages of the memory cells should be within one or more distributions (ranges) of threshold voltages for programmed memory cells or within a distribution (range) of threshold voltages for erased memory cells, as appropriate. FIG. 9A illustrates example threshold voltage distributions (ranges) for MLC memory cells that store three bits of data. Other embodiments, however, may use other data capacities per memory cell (e.g., such as one, two, four, or five bits of data per memory cell). FIG. 9A shows eight threshold voltage distributions, corresponding to eight data states. The first threshold voltage distribution (data state) S0 represents memory cells that are erased. The system uses an erase verify reference voltage Vme to test whether the memory cells are sufficiently erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 9A also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 9A also shows seven verify reference voltages (also referred to as program verify targets) Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. Example voltages for FIG. 9A are Vr1=0 v, Vr2=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 9A represent the full sequence programming. The technology described herein can also be used with other types of programming in addition to full sequence programming (including, but not limited to, multiple stage/phase programming). In some embodiments, data states S1-S7 can overlap, with controller 102 relying on an ECC algorithm to identify the correct data.

Figure 9B:
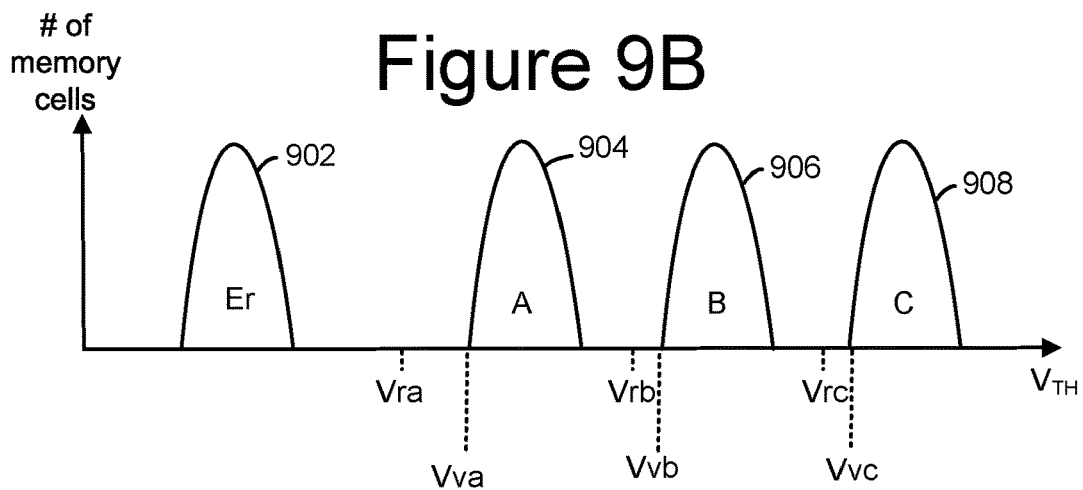
FIG. 9B depicts one embodiment of a set of threshold voltage distributions for a four-state memory device in which each storage element stores two bits of data.

FIG. 9B depicts one embodiment of a set of threshold voltage distributions for a four-state memory device in which each storage element stores two bits of data. A first threshold voltage (Vth) distribution 902 is provided for erased (Er-state) storage elements. Three Vth distributions 904, 906 and 908 represent programmed states A, B and C, respectively. In one embodiment, the threshold voltages in the Er-state and the threshold voltages in the A, B and C distributions are positive. In another embodiment, the threshold voltage distribution for the Er-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In the example of FIG. 9B, a multi-state storage element stores data for two different pages: a lower page and an upper page. Four states are depicted by the threshold voltage distributions 902, 904, 906 and 908. These states, and the bits they represent, are: Er-state (11), A-state (01), B-state (00) and C-state (10). For Er-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

Figure 9C:
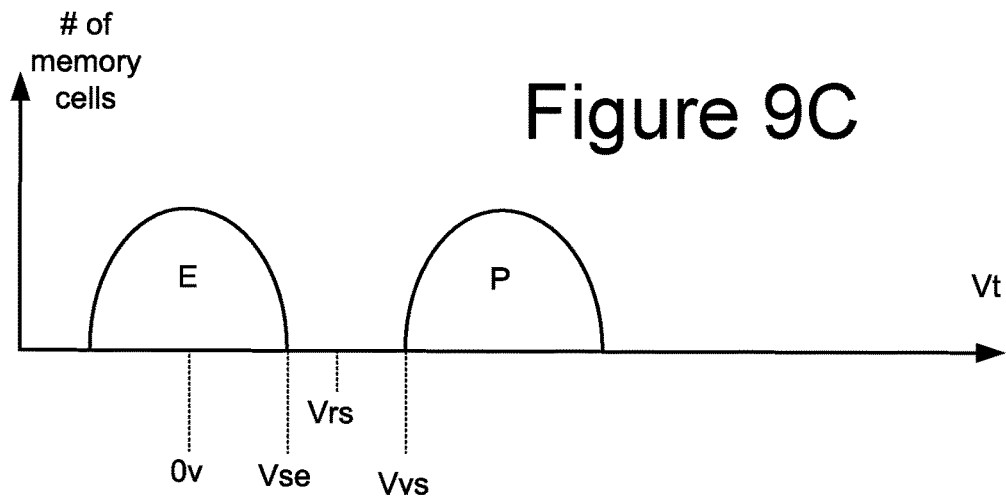
FIG. 9C is a graph of number of memory cells versus threshold voltage in which each storage element stores a single bit of data.

FIG. 9C illustrates example threshold voltage distributions (ranges) for SLC memory cells. As discussed above, SLC memory cells can be erased or programmed. When erased, the SLC memory cells have threshold voltages in the erased threshold voltage distribution (range) E. When programmed, the SLC memory cells have threshold voltages in the programmed threshold voltage distribution (range) P.

FIG. 9C also shows a read reference voltage (also referred to as read compare voltage) Vrs, a verify reference voltage (also referred to as program verify target) Vvs and an erase verify target Vse. When programming from E to P, the system raises the threshold voltages of the memory cells until they reach at least Vvs. When erasing from P to E, the system lowers the threshold voltages of the memory cells until they reach at least Vse. To read a memory cell storing SLC data, the systems test whether the threshold voltage of the memory cells is less than or greater than Vrs. Example voltages for FIG. 9C are Vse=Vr2=1 v, Vrs=1.2 v and Vvs=2.4 v.

Figure 10A:
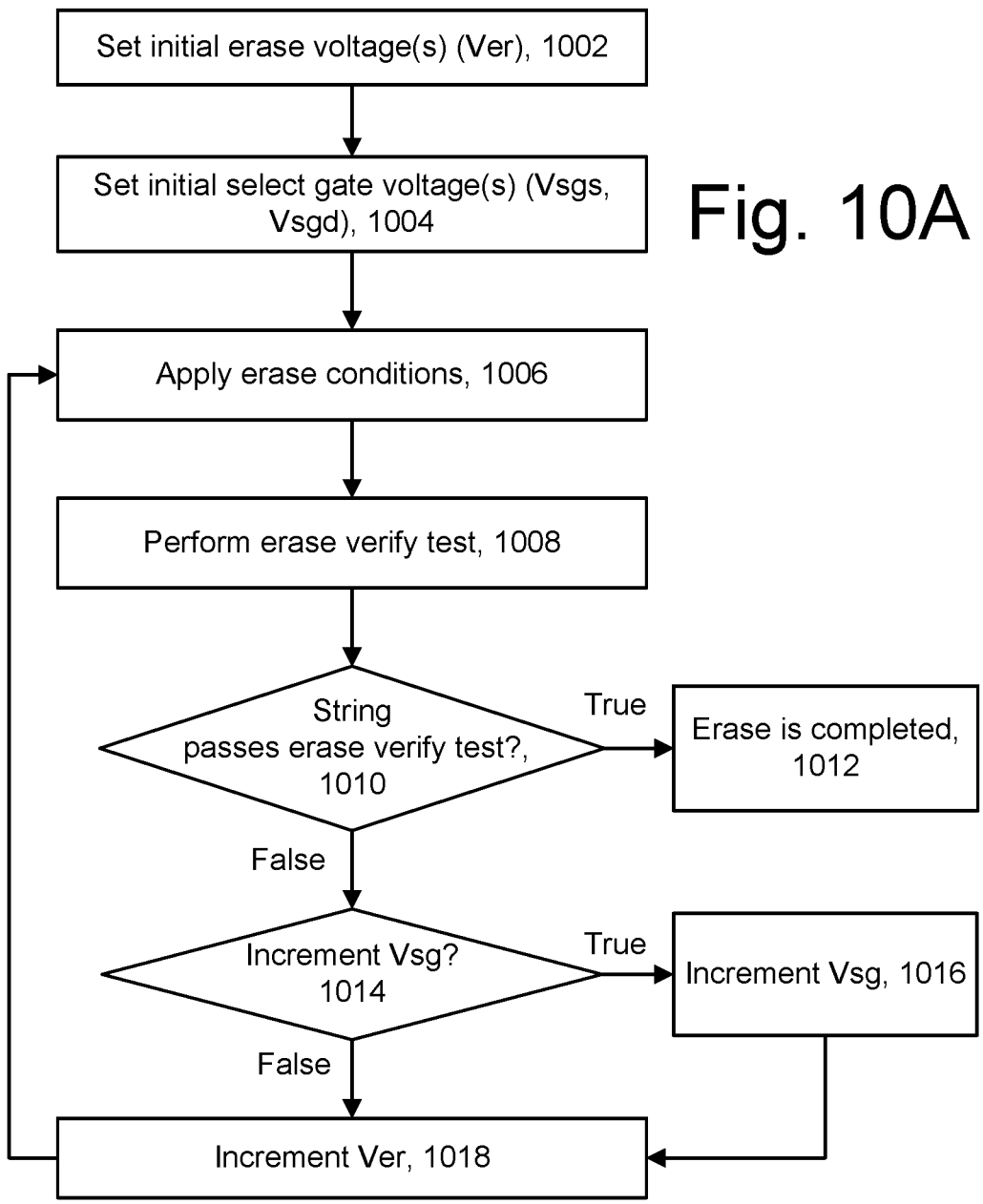
FIG. 10A depicts one embodiment of a process for performing an erase operation.

FIG. 10A depicts one embodiment of a process for performing an erase operation. The process is described with respect to a NAND string of non-volatile memory cells. The NAND string includes a select transistor on each end of the NAND string. For example, a first select transistor may be a drain side select transistor, which has one of its terminals (e.g., drain) coupled to a bit line. A second select transistor may be a source side select transistor, which has one of its terminals coupled to a source line. The process may be performed in parallel on many NAND strings. Therefore, process may be used to erase a set of word lines. The process may be used to erase a NAND string such as depicted in FIGS. 5A, 5B, 6 and 7A. In some embodiments, only the portion of a NAND string that is within a selected tier (e.g., upper tier 510 or lower tier 508) is erased as a unit.

Step 1002 sets a magnitude of an initial steady state erase voltage (Ver). In one embodiment, the process performs a two-sided GIDL erase. The erase voltage pulse is to be applied to the bit line and to the source line. In one embodiment, the steady state magnitude of the erase voltage pulse is different for the bit line and the source line. In one embodiment, the magnitude of the steady state erase voltage is the same for the bit line and the source line. Step 1002 refers to the voltage that is applied to the end of the bit line and the source line that is not adjacent to the select transistors.

Step 1004 sets a magnitude of an initial select gate voltage (Vsg). Herein, Vsg may be referred to as an erase voltage, as it helps to establish a GIDL voltage between two terminals of a select transistor. A select gate voltage (Vsgd) pulse is provided to the drain side select line (e.g., SGD) that is connected to a control gate of a drain side select transistor. A select gate voltage (Vsgs) pulse is provided to the source side select line (e.g., SGS) that is connected to a control gate of a source side select transistor. The magnitudes of Vsgd and Vsgs may be the same as each other or different from each other.

Step 1006 includes applying erase conditions. Step 1006 may include applying voltage pulses to a bit line, a source line, a select line connected to a drain side select transistor, a select line connected to a source side select transistor, and word lines connected to control gates of memory cells. The same magnitude or different magnitude erase voltages may be applied to the bit line and the source line. In one embodiment, the drain select line and the source select line are left floating. Erase enable voltages may be applied to the word lines. Step 1006 may include controlling the timing of the various signals.

Step 1006 may include charging up (e.g., increasing the voltage of) a channel of the memory string from both the source and the drain end, and setting a low voltage such as 0 V on the word lines connected to the control gates of the memory cells. In one embodiment, charging up the channels includes applying a suitable voltage to the drain side and/or the source side select gates to generate GIDL current.

Step 1008 includes performing an erase verify test for a NAND string. Typically, this involves setting an erase verify voltage (e.g., Vme) to the word lines that are connected to control gates of memory cells on the string while sensing a current in the memory string. If the current is sufficiently high, the NAND string is considered to pass the verify test. If the NAND string passes the erase verify test at decision step 1010, the erase operation is completed, at step 1012. If the NAND string does not pass the erase verify test at decision step 1010, the process continues at step 1014.

Step 1014 includes a determination of whether the select gate voltage is to be incremented. If so, then the select gate voltage is incremented in step 1016. Whether or not the select gate voltage is incremented, the erase voltage is incremented in step 1018. Then, the next iteration of the erase procedure is performed by returning to step 1006. An erase iteration (or loop) typically involves applying erase conditions followed by performing a verify test, although in some cases the verify test is omitted.

Figure 10B:
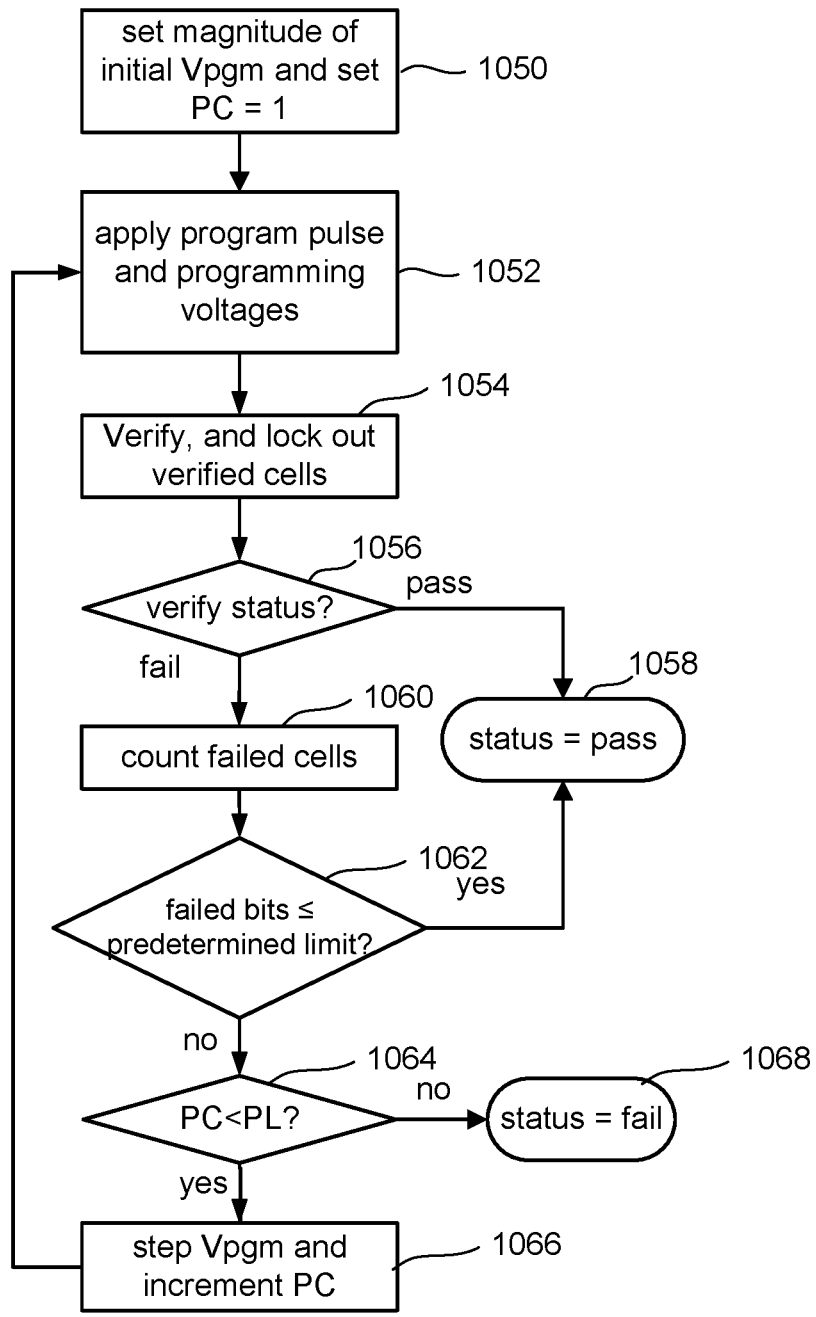
FIG. 10B is a flow chart describing one embodiment of a process for programming.

FIG. 10B is a flowchart describing one embodiment of a process for programming. The process of FIG. 10B is performed by the memory die 300 in response instructions, data and one or more addresses from controller 102. The process of FIG. 10B can also be used to implement the full sequence programming discussed above. The process of FIG. 10B can also be used to implement each phase of a multi-phase programming operation such as the multi-phase example in FIG. 11A-11B or the multi-phase example in FIG. 12A-12B. Additionally, the process of FIG. 10B can be used to program memory cells connected to the same word line. In one embodiment, the controller 102 instructs the memory die 300 which word line (as well as which block or sub-block) should be programmed. Thus, the controller 102 is able to manage the order in which word lines are programmed.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 1050 of FIG. 10B, the programming voltage (Vpgm) is initialized to the starting magnitude (e.g., ~12-16V or another suitable level) and a program counter PC maintained by the state machine is initialized at 1. In step 1052, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 1052, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 1054, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 1056, it is determined whether all the memory cells have reached their target threshold voltages (pass). If so, the programming process is complete and successful because all selected memory cells were programmed and verified to their target data states. A status of "PASS" is reported in step 1058. If, in 1056, it is determined that not all of the memory cells have reached their target threshold voltages (fail), then the programming process continues to step 1060.

In step 1060, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1062, it is determined whether the count from step 1060 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 1058. In this situation, enough memory cells programmed correctly such that the few remaining memory cells that have not been completely programmed can be corrected using ECC during the read process. In some embodiments, step 1060 will count the number of failed cells for each page, each target data state or other unit, and those counts will individually or collectively be compared to a threshold in step 1062.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program/erase cycles performed or other criteria.

If number of failed memory cells is not less than the predetermined limit, than the programming process continues at step 1064 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 1068. This is one example of a program fault. If the program counter PC is less than the program limit value PL, then the process continues at step 1066 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 1066, the process loops back to step 1052 and another program pulse is applied to the selected word line so that another iteration (steps 1052-1066) of the programming process of FIG. 10B is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 9A) or verify operation (e.g. see verify reference voltages Vv1, Vv2, Vv3, Vv4, Vv5, Vv6, and Vv7 of FIG. 9A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 102 receives a request from the host (or a client, user, etc.) to program host data (data received from the host) into the memory system. In some embodiments, controller 102 arranges the host data to be programmed into units of data. For example, controller 102 can arrange the host data into pages, partial pages (a subset of a page), word line units, blocks, jumbo blocks, or other units.

As noted above, the process of FIG. 10B may be used to implement a multi-phase programming operation. FIG. 11A-11B depict one embodiment of a multi-phase programming operation that has a coarse phase (FIG. 11A) followed by a fine phase (FIG. 11B). FIG. 12B-12C depict one embodiment of a multi-phase programming operation in which one bit is programmed into each memory cell each phase. In some embodiments, the process of FIG. 10B is performed once for each phase of a multi-phase programming operation.

FIG. 11A depicts the first phase of the multi-phase programming operation, which includes programming the memory cells from the erased state (S0) to any of the programmed data states S1-S7, similar to full sequence programming. However, rather than using the standard verify reference voltages (e.g., Vv1, Vv2, Vv3, Vv4, Vv5, Vv6, and Vv7), the process of FIG. 11A uses an alternate set of verify reference voltages (e.g., Vv1', Vv2', Vv3', Vv4,' Vv5', Vv6', and Vv7') that are each slightly lower than the corresponding standard verify reference voltage. Thus, the threshold voltages of FIG. 11A can be thought of as intermediate threshold voltage distributions (or intermediate data states) that are at lower voltages than the threshold voltages of FIG. 9A. Note that memory cells in the erased state S0 that are to be in data state S0, are inhibited from programming.

FIG. 11B depicts the second (and last) phase of the multi-phase programming operation, which includes programming the memory cells to tighten the threshold distributions. Thus, the memory cells are programmed from the intermediate threshold voltage distributions (or intermediate data states) of FIG. 11A to the final or target threshold voltage distributions (or data states) of FIG. 11B using the standard verify reference voltages (e.g., Vv1, Vv2, Vv3, Vv4, Vv5, Vv6, and Vv7). FIG. 11A is referred to as the coarse phase and FIG. 11B as the fine phase. The coarse phase could also be referred to as a rough phase or as a foggy phase. The fine phase could also be referred to as a high-accuracy phase. In one embodiment, the coarse phase of FIG. 11A is performed for a given word line, followed by the coarse phase for the next word line. The coarse phase for the next word line could give rise to interference for the given word line, thereby widening the intermediate threshold voltage distributions, which could lead to errors when reading the data. However, the fine phase of FIG. 11B is subsequently performed after the coarse phase for the next word line, removing or reducing the effects of interference from the next word line. Note that memory cells in the erased state E that are to be in data state S0, are inhibited from programming.

In one embodiment, the coarse-fine program scheme is implemented in a Bit-Cost-Scalable (BiCs) architecture. FIGS. 11A and 11B depict an example in which memory cells are programmed to three bits per memory cell. In one embodiment, memory cells are programmed to four bits per memory cell (referred to herein as "QLC", quad level cell). A coarse-fine program scheme can compensate for Neighbor Word line Interference ("NWI") effect significantly by reducing the threshold voltage (Vt) difference between coarse and fine. A coarse-fine program scheme may be used for to program memory cells that store two-, three-, four-, five-, or more than five-bits per cell.

In one embodiment after performing the first programming phase depicted in FIG. 11A on a given word line, the first programming phase depicted in FIG. 11A is performed on another word line that is later in the sequence. Afterwards, the second programming phase depicted in FIG. 11B is performed on the given word line. For example, when programming word lines sequentially from WL0 to WL96, the sequence may be as depicted in Table I. The numbers in the columns labeled First Pass and Second Pass indicate the order in the programming phases occur. As defined herein, the sequential order in which the word lines are programmed is the order in which the final programming phase is performed. In Table I, the final phase is the second phase, but there may be more phases in some multi-phase programming processes. Thus, the word line sequential programming order in Table I is WL0, WL1, . . . WL95.

TABLE I

| WL | First Pass | Second Pass |
|---|---|---|
| 0 | 1 | 3 |
| 1 | 2 | 5 |
| 2 | 4 | 7 |
| 3 | 6 | 9 |
| ... | | |
| 93 | 186 | 189 |
| 94 | 188 | 191 |
| 95 | 190 | 192 |

Table II describes the sequence for one embodiment in which programming proceeds sequentially from WL95 to WL0. Note that the sequence in Table II is one example of reversing the WL programming sequence relative to the sequence in Table I. Thus, the word line sequential programming order in Table II is WL95, WL94, . . . WL0.

TABLE II

| WL | First Pass | Second Pass |
|---|---|---|
| 95 | 1 | 3 |
| 94 | 2 | 5 |
| 93 | 4 | 7 |
| 92 | 6 | 9 |
| ... | | |
| 2 | 186 | 189 |
| 1 | 188 | 191 |
| 0 | 190 | 192 |

Figure 12A:
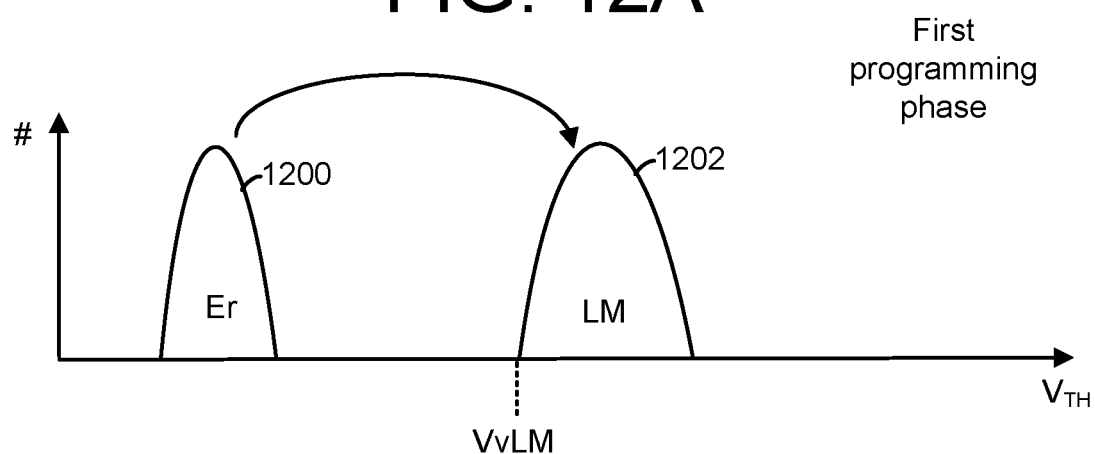
FIGS. 12A and 12B describe one example of a multi-phase programming operation in which one bit is stored in each memory cell each phase.
Figure 12B:
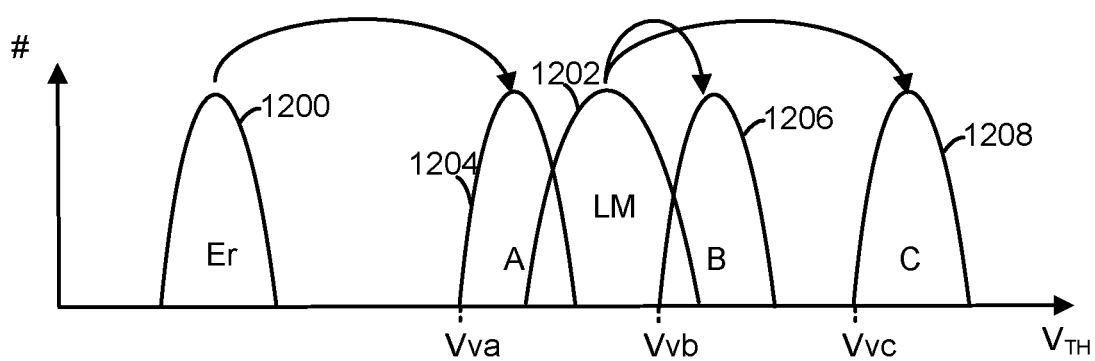

FIGS. 12A-12B depict how a multi-phase programming technique can be used to program one bit into each memory cell with each programming phase. This example is for two bits per memory cell, but can be extended to a greater number of bits per memory cell. FIG. 12A depicts the first phase and FIG. 12B depicts the second phase.

In the first programming phase, the lower page is programmed for a selected word line WLn. If the lower page is to remain data 1, then the storage element state remains at state Er (distribution 1200). If the data is to be programmed to 0, then the threshold voltage of the storage elements on WLn are raised such that the storage element is programmed to an intermediate (LM or lower-middle) state (distribution 1202).

FIG. 12B depicts one embodiment of a second (and final) phase of the two-phase programming technique. The A-state storage elements are programmed from the Er-state distribution 1200 to the A-state distribution 1204, the B-state storage elements are programmed from the LM-state distribution 1202 to the B-state distribution 1206, and the C-state storage elements are programmed from the LM-state distribution 1202 to the C-state distribution 1208.

In one embodiment after performing the first programming phase depicted in FIG. 12A on a given word line, the first programming phase depicted in FIG. 12A is performed on another word line that is later in the sequence. Afterwards, the second programming phase depicted in FIG. 12B is performed on the given word line. For example, when programming word lines sequentially from WL0 to WL96, the sequence may be as depicted in Table I above. The multi-phase programming process in FIGS. 12A and 12B may be reversed such as in Table II, which was discussed above.

As noted above, error recovery techniques can be time consuming and might not be successful. Technology is disclosed herein for programming order reversal. In some embodiments, the order in which a set of word lines are programmed is reversed at some point. For example, initially a set of word lines in a block or sub-block may be programmed sequentially in a direction from the source end of the block (or sub-block) to the drain end of the block (or sub-block). At some point, the program order may be reversed such that the set of word lines may be programmed sequentially in a direction from the drain end of the block (or sub-block) to the source end of the block (or sub-block).

Reversing the sequential order of programming a set of word lines can improve error recovery. In some cases, when programming a set of word lines, it can be beneficial to have a problem word line programmed early within the set. In one embodiment, the sequential order of programing a set of word lines is reversed to place a problem word line earlier in the sequence. In other cases, when programming a set of word lines, it can be beneficial to have a problem word line programmed later with the set.

FIG. 13 is a flowchart of one embodiment of a process 1300 of programming non-volatile memory, which includes changing an order of programming word lines. Process 1300 may be used to change the order in which a set of word lines is programmed. In one embodiment, the change is to reverse a sequential order of programming the set of word lines. However, process 1300 is not limited to reversing the sequential programming order. In one embodiment, process 1300 is used to program non-volatile memory cells in a three-dimensional structure, such as storage device 400. The three-dimensional structure has one or more tiers. In one embodiment, the three-dimensional structure has a single tier. In one embodiment, the three-dimensional structure has multiple tiers. In one embodiment, the control circuit is configured to erase memory cells in one tier independent of memory cells in a tier above or below.

In one embodiment, process 1300 is used to program a block of memory cells, such as BLK0 in FIG. 7A. In one embodiment, process 1300 is used to program a sub-block of memory cells, such as sub-block SB0 in FIG. 7A. In one embodiment, process 1300 is used to program one tier in a block or a sub-block. For example, process 1300 may be used to program a lower tier that includes word lines WL0-WL47 in FIG. 7A. As another example, process 1300 may be used to program an upper tier such as word lines WL48-WL95 in FIG. 7A. As still another example, process 1300 could be used to program WL0-WL95 in a single tier device such as an embodiment depicted in FIG. 5B or to program WL0-WL95 in a multi-tier device such as an embodiment depicted in FIG. 5A. Process 1300 is not limited to the foregoing examples. Process 1300 may be used with a full sequence programming technique such as depicted in FIG. 9A, or a multi-phase programming technique such as depicted in FIGS. 11A-11B or 12A-12B.

Step 1302 includes programming a set of word lines in a non-volatile memory device in a first order. As noted herein, the phrase "programming a set of word lines" means to program first non-volatile memory cells connected to a first word line in the set, program second non-volatile memory cells connected to a second word line in the set, etc. Herein, the phrase "programming a set of word lines in an order" means that one word line is programmed at a time with the order of programming proceeding from one word line to the next in the set of word line. The set of word lines may be arranged in any order.

In one embodiment, step 1302 includes programming the set of word lines in the non-volatile memory device in a first sequential order. Herein, the phrase "programming a set of word lines in sequential order" means that one word line is programmed at a time with the order of programming proceeding from one word line to the immediate neighbor in the same direction. For example, the word lines could be programmed sequentially from WL0 to WL95. As another example, the word lines could be programmed sequentially from WL95 to WL0. The sequential order is not required to start from the lowest or highest numbered word line. In other words, the sequential order is not required to start from a word line at a physical end of the set of word lines. For example, the sequential order could be WL16, WL17, . . . WL95, WL0, WL1, . . . WL15.

Step 1304 includes erasing the set of word lines. Herein, the phrase "erasing a word line," or the like, means to erase non-volatile memory cells that are connected to the word line. Thus, erasing a set of word lines means to erase non-volatile memory cells connected to the word lines in the set. In one embodiment, the set of word lines are a unit of erase. In one embodiment, the set of word lines include at least one unit of erase. A unit of erase is the smallest unit of memory cells for an erase operation. Thus, when a set of word lines is a unit of erase the set is connected to all the memory cells in the unit of erase. In one embodiment, all word lines in a block are erased as a unit. In one embodiment, all word lines in a sub-block are erased as a unit. In one embodiment, all word lines in a tier are erased as a unit. For example, word lines in the upper tier (e.g., WL48-WL95) may be erased as a unit, without erasing any of the word lines in the lower tier (e.g., WL0-WL47).

Step 1306 includes a determination of whether to change (e.g., reverse) the order in which the set of word lines are programmed. This determination may be made on a number of factors including, but not limited to, a program/erase cycle count and whether a defect is found. The program/erase cycle count refers to the number of times that the set of word lines has been through a program/erase cycle. In one embodiment, when the program/erase cycle count exceeds a threshold, the order of programming the word lines is changed. The defect could be any defect in the non-volatile storage device. One example of a defect is that a certain word line is experiencing an unusually high error count. The error count refers to how many bits that were stored in a group of memory cells that when read back have flipped from their programmed state. The error may be determined by the ECC engine 226/256.

In one embodiment, the determination is based on whether there is a defect in the non-volatile storage device. The defect could be within the block or sub-block that includes the set of word lines, but that is not required. The defect could be with a different block or sub-block. However, such a defect may suggest a likelihood that there could be a similar defect with the block (or sub-block) being programmed. For example, if a defect is found in connection with WL95 in one block, this may suggest a likelihood of a similar defect with WL95 in the block being programmed.

If the determination is to not change the programming order, then control passes to step 1302. If the determination is to change the programming order, then control passes to step 1308.

Step 1308 includes programming the set of word lines in a second order that is different the first order. Note that because the determination to use the second order may be based on program/erase cycle, it may be stated that the second order varies the programming order by program/erase cycle. As one example, the first order might be to program the word lines sequentially from WL0 to WL95, and the second order might be to move one or more of the highest numbered word lines earlier in the program order. For example, WL95 might be programmed first or at least early in the program order. Thus, in this example, the second order is non-sequential.

In one embodiment, step 1308 includes programming the set of word lines in a second sequential order that is a different from the first sequential order. For example, if the first set of word lines were programmed sequentially from WL0 to WL95, the second set of word lines could be programmed sequentially from WL16 to WL96, and then programmed sequentially from WL0 to WL15. Note that because the determination to use the second sequential order may be based on program/erase cycle, it may be stated that the second sequential order varies the programming order by program/erase cycle.

In one embodiment, step 1308 includes programming the set of word lines in a second sequential order that is a reverse of the first sequential order. For example, if the first set of word lines were programmed sequentially from WL0 to WL95, the second set of word lines could be programmed sequentially from WL95 to WL0. On the other hand, if the first set of word lines were programmed sequentially from WL95 to WL0, the second set of word lines could be programmed sequentially from WL0 to WL95. Further examples of reversing the sequential order are discussed below.

As noted above, changing (e.g., reversing) the sequential order of programming a set of word lines can improve error recovery. In some cases, when programming a set of word lines, it can be beneficial to have a problem word line programmed early within the set. An example of a problem word line is one for which programming may be more likely to fail than other word lines. In one embodiment, the order of programing a set of word lines is changed to place a problem word line earlier in the programing sequence. For example, in step 1306 is might be determined that WL95 on a given die tends to be a problem word line (e.g., more likely to be defective). The program order can be changed for all blocks on that die in order to put WL95 earlier in the programming order. This change could also be done on a block by block basis.

In other cases, when programming a set of word lines, it can be beneficial to have a problem word line programmed later with the set. For example, in step 1306 is might be determined that WL0 on a given die tends to be a problem word line (e.g., more likely to be defective). The program order can be changed for all blocks on that die in order to put WL0 later in the programming order. This reversal could also be done on a memory block by memory block basis.

Also, the discovery of a problem word line on a given memory die may, in some cases, suggest that a similarly located word line on another memory die may be a problem word line. Hence, the decision to change the programming order on one memory die could be based on information learned from another memory die.

In some embodiments, the program order in a first set of word lines is different (e.g., the reverse) from a second set of word lines. For example, a first set of word lines may be programmed sequentially in an order from WL0 to WL95 and the second set of word lines may be programmed sequentially from WL95 to WL0. The first and second sets of word lines may be part of a meta-block. The first and second sets of word lines could be on the same memory die or on two different memory dies. Reversing the sequential order in which one set of word lines is programmed relative to the sequential order in which another set of word lines is programmed can improve error recovery. As one example, this can help to improve error recovery if, for example, redundancy data is created based on the order in which word lines were programmed in different memory die.

FIG. 14 is a flowchart of one embodiment of a process 1400 of programming non-volatile memory. Process 1400 describes programming a first set of word lines in a first order and a second set of word lines in a second order that is the different of the first order. In one embodiment, the first order is a first sequential order and the second order is a second sequential order that is different from the first sequential order. In one embodiment, the second sequential order that is a reverse of the first sequential order. In one embodiment, process 1400 is performed as a result of changing (e.g., reversing) the order of programming one of the sets of word lines, but not changing (e.g., reversing) the order of the other set. In other words, at one point in time both sets of word lines are programmed in the same order. Then, a process such as process 1300 is performed on one of the sets of word lines, but not the other set of word lines.

However, it is not required to perform a process such as process 1300 on one of the sets of word lines in order to perform process 1400. In one embodiment, process 1400 is performed the first time that the first and second sets of word lines are programmed. In one embodiment, throughout the lifetime of the non-volatile storage device, the second set of word lines is programmed in the different (e.g., reverse) order as the first set of word lines.

In one embodiment, process 1400 is used to program non-volatile memory cells in a three-dimensional structure, such as storage device 400. The three-dimensional structure has one or more tiers. In one embodiment, the three-dimensional structure has a single tier. In one embodiment, the three-dimensional structure has multiple tiers. In one embodiment, the control circuit is configured to erase memory cells in one tier independent of memory cells in a tier above or below.

Step 1402 includes programming a first set of word lines in a non-volatile memory device in a first order. In one embodiment, the first order is a sequential order. However, it is not required that the programming go through the entire first set of word lines sequentially. For example, a non-sequential programming order could be WL0, WL2, WL1, WL4, WL3, WL6, WL5, etc. Another example of a non-sequential programming order is to use a scrambler to randomize the programming order. This scrambling could be performed on a chunk of several word lines. For example, WL0-WL3 could be programmed in the random order WL1, WL3, WL0, WL2. Scrambling can be performed on other groups of word lines in the set (e.g., WL4-WL95) as well. The groups can all have the same size, but that is not required. The scrambling seed can be the same or different for each group.

The first set of word lines is in a first three-dimensional structure. One example of the first set of word lines is WL0 to WL 95 in BLK0 in FIG. 5A or 5B. In some cases, one sub-block in the block is programmed at a time, in which case the first set of word lines could be WL0 to WL95 in one of the sub-blocks (e.g., SB0). Another example of the first set of word lines is the word lines in one tier. For example, the first set of word lines could be WL0 to WL47 in the lower tier of BLK0. Alternatively, the first set of word lines could be WL48 to WL95 in the upper tier of BLK0.

Step 1404 includes programming a second set of word lines in the non-volatile memory device in a second order that is a different from the first order. In one embodiment, the second order and the first order are both sequential, with the second sequential order being the reverse of the first sequential order. For example, if the first set of word lines were programmed sequentially from WL0 to WL95, the second set of word lines could be programmed sequentially from WL95 to WL0. In one embodiment, the first and second sets of word lines are programmed in the same direction but starting at a different word line. For example, if the first set of word lines were programmed sequentially from WL0 to WL95, the second set of word lines could be programmed sequentially from WL16 to WL95 and then sequentially from WL0 to WL15.

In one embodiment, the first and second sets of word lines are programmed in a non-sequential manner. As noted above, scrambling could be performed on a chunk of several word lines. However, the second set of word lines may be randomized (or scrambled) in a different manner than the first set. For example, if WL0-WL3 in the first set were programmed in the random order WL1, WL3, WL0, WL2, then WL0-WL3 in the second set might be programmed in the random order WL2, WL1, WL0, WL3. Using a different random order for the first set and second set can help to improve error recovery.

The second set of word lines are in a second three-dimensional structure. The first and second set of word lines are at the same level of the respective first and second three-dimensional structures. For example, if the first set of word lines is WL0 to WL 95 in a block, then the second set of word lines are also word lines is WL0 to WL 95 in a different block (which may be on the same memory die or a different memory die). As another example, if the first set of word lines is WL0 to WL95 in a sub-block (e.g., SB0 of BLK0), then the second set of word lines is WL0 to WL95 in another sub-block. The other sub-block could be in the same block or a different block. The other sub-block could be on the same memory die or another memory die. As still another example, if the first set of word lines are the word lines in one tier (e.g., WL0 to WL47 in the lower tier), then the second set of word lines are the word lines in the tier at the same level (in this example WL0 to WL47 in the lower tier). In this tier example, the first and second sets of word lines could be in different sub-blocks in the same block, could be in different blocks on the same memory die, or could be on different memory dies. Note that the first and second three-dimensional structures may be the same three-dimensional structure. However, in some embodiments, the first and second three-dimensional structure are different three-dimensional structures.

In one embodiment, the first and second sets of word lines are programmed concurrently. Herein, the phrase "concurrently programming a first and a second set of word lines"

means that the controller 102 schedules circuitry to perform the programming of the first and second sets of word lines such that the programming of the first and second sets of word lines is capable of occurring at the same time. Thus, the circuitry is capable of programming the respective first and second sets of word lines at the same time. Also, the controller 102 schedules the instructions for both the first and second sets prior to either the first or the second set having its programming completed. For example, the controller 102 may schedule instructions for two different memory die (which contain the first and second sets of word lines), such that the programming may occur at the same time. However, due to factors such as when each memory die executes the instructions the actual programming of the first and second sets of word lines might or might not occur at the same time.

In one embodiment, the first set of word lines are on a first memory die 300 and the second set of word lines are on a second memory die 300. Thus, it may be stated that the second order varies the programming order by memory die. In this case, the memory controller 102 may issue separate instructions to each memory die to program the respective word lines. Note that the first programming order and second programming order may each be sequential in which case it may be stated that the second sequential order varies the programming order by memory die.

In one embodiment, the first set of word lines and the second set of word lines are in different memory blocks on the same memory die. Thus, it may be stated that the second order varies the programming order by memory block. In this case, the memory controller 102 may issue instructions to the same memory die to program the respective word lines. Note that the first programming order and second programming order may each be sequential in which case it may be stated that the second sequential order varies the programming order by memory block.

In one embodiment, process 1400 is used to program meta-pages. FIG. 15A depicts one example of how process 1400 can be used to program meta-pages. FIG. 15A pertains to an example in which one block is programmed on each of eight memory die. Three bits are programmed into each memory cell. There are 96 word lines in a block in this example. In one embodiment, each block of memory cells is each divided into four sub-blocks, such as SB0, SB1, SB2, and SB3 (see, for example, FIG. 7A). Thus, a block contains 1152 physical pages (96 word lines×3 bits per memory cell×4 sub-blocks). In this example, the number of memory cells connected to a word line equals one page.

The table 1500 of FIG. 15A is organized into a first column (WL) that lists the word line (WL). The sub-blocks are not expressly depicted in FIG. 15A. Thus, note that the 12 physical pages for each word line are arrived at by programming three pages per word line in each of four sub-blocks. FIGS. 15B and 15C show two alternatives for how the sub-blocks may be programmed. The table 1500 in FIG. 15A has a separate column for each of eight memory die (Die 0 to Die 7), to show which pages are programmed into which word line/plane combinations for that memory die.

In the example in FIG. 15A, 1152 meta-pages (page 0 to page 1151) are programmed in memory die 0 to memory die 7. A meta-page has eight physical pages in this example. Each physical page of the meta-page is programmed into one memory die. For example, one physical page of meta-page 0 is programmed into each of WL0 of Die 0, WL0 of Die 2, WL0 of Die 4, WL0 of Die 6, WL95 of Die 1, WL95 of Die 3, WL95 of Die 5, and WL95 of Die 7. In one embodiment, the physical pages of the meta-page are programmed concurrently.

The word lines in each memory die are programmed in a sequential order from lowest page number to highest page number. For example, die 0 is programmed from WL0 sequentially to WL95. Die 1 is programmed from WL95 sequentially to WL0, which is the reverse of die 1.

In one embodiment, one word line is programmed for all four sub-blocks prior to proceeding to the next word line in the block. FIG. 15B depicts one possible order for programming the sub-blocks. Table 1510 depicts an order in which word lines and sub-blocks may be programed for die 0, consistent with the example in table 1500. For example, the order for die 0 may be: WL0/SB0, WL0/SB1, WL0/SB2, WL0/SB3, WL1/SB0, WL1/SB1, WL1/SB2, WL1/SB3, . . . WL95/SB0, WL95/SB1, WL95/SB2, WL95/SB3. Table 1515 depicts an order in which word lines and sub-blocks may be programed for die 1, consistent with the example in table 1500. The order for die 1 may be: WL95/SB0, WL95/SB1, WL95/SB2, WL95/SB3, WL94/SB0, WL94/SB1, WL94/SB2, WL94/SB3, WL0/SB0, WL0/SB1, WL0/SB2, WL0/SB3.

In the example in FIG. 15B, the sub-blocks are programmed in the order SB0, SB1, SB2, SB3 in each die. It is also possible to reverse the order of sub-block programming when reversing the order of word line programming. FIG. 15C depicts one possible order for programming the sub-blocks. Table 1520 depicts an order in which word lines and sub-blocks may be programed for die 0, consistent with the example in table 1500. The example is the same as in table 1510. Table 1525 depicts an order in which word lines and sub-blocks may be programmed for die 1, consistent with the example in table 1500. The order for die 1 may be: WL95/SB3, WL95/SB2, WL95/SB1, WL95/SB0, WL94/SB3, WL94/SB2, WL94/SB1, WL94/SB0, . . . WL0/SB3, WL0/SB2, WL0/SB1, WL0/SB0.

In one embodiment, all of the word lines in a sub-block are programmed prior to programming any word lines in the next sub-block. FIG. 15D depicts examples of programing one block of memory cells in which all of the word lines in a sub-block are programmed prior to programming any word lines in the next sub-block. Three bits are programmed into each memory cell. There are 96 word lines and four sub-blocks in these examples. Table 1540 depicts one example of how word lines and sub-blocks may be programmed for die 0. Table 1550 depicts one example of how word lines and sub-blocks may be programmed for die 1 in combination with the example of table 1540 for die 0. Table 1560 depicts another example of how word lines and sub-blocks may be programmed for die 1 in combination with the example of table 1540 for die 0. A difference between tables 1550 and 1560 is that the sub-block programming order is reversed.

Referring now to table 1540, the sub-block programming order may be, for example, SB0, SB1, SB2, SB3. For example, the order for die 0 may be: WL0/SB0, WL1/SB0, WL2/SB0, . . . WL95/SB0, WL0/SB1, WL1/SB1, WL2/SB1, . . . WL95/SB1, . . . WL0/SB2, WL1/SB2, WL2/SB2, . . . WL95/SB2, . . . WL0/SB3, WL1/SB3, WL2/SB3, . . . WL93/SB3, WL94/SB3, WL95/SB3. Referring now to table 1550, the order for die 1 may be: WL95/SB3, WL94/SB3, WL93/SB3, . . . WL0/SB3, WL95/SB2, WL94/SB2, WL93/SB2, . . . WL0/SB2, . . . WL95/SB1, WL94/SB1, WL93/SB1, . . . WL0/SB1, . . . WL95/SB0, WL94/SB0, WL93/SB0, . . . WL0/SB0. In this example, the order of programming the strings is reversed in die 1 (relative to die 0). However, in another embodiment, the strings are programmed in the same order (e.g., SB0, SB1, SB2, SB3), while reversing the order in which the word lines are programmed. Referring now to table 1560, the order for die 1 may be: WL95/SB0, WL94/SB0, WL93/SB0, . . . WL0/SB0, WL95/SB1, WL94/SB1, WL93/SB1, . . . WL0/SB1, . . . WL95/SB2, WL94/SB2, WL93/SB2, . . . WL0/SB2, . . . WL95/SB3, WL94/SB3, WL93/SB3, . . . WL0/SB3.

Reversing the sequential order in which one set of word lines is programmed relative to the sequential order in which another set of word lines is programmed as depicted in FIGS. 14 and 15A-15D can improve error recovery. For example, in addition to die 0 to die 7, there may be a redundancy die that is formed from the data in die 0 to die 7. In one embodiment, a spare memory die may be used to store the redundancy data, which may formed from a bitwise Exclusive OR (XOR) of data from memory die 0 to die 7. For example, a bitwise XOR may be performed for each physical page in table 1500. Using page 0 as an example, note that WL0 is involved for memory die 0, die 2, die 4, and die 6. However, for page 0, WL95 is involved for memory die 1, die 3, die 5, and die 7. In one embodiment, the redundancy data may be used to recover the data providing that the data from seven of the eight dies is available. Reversing the programming order, as in table 1500, increases the chances that the redundancy data will be able to recover the data.

Figure 16:
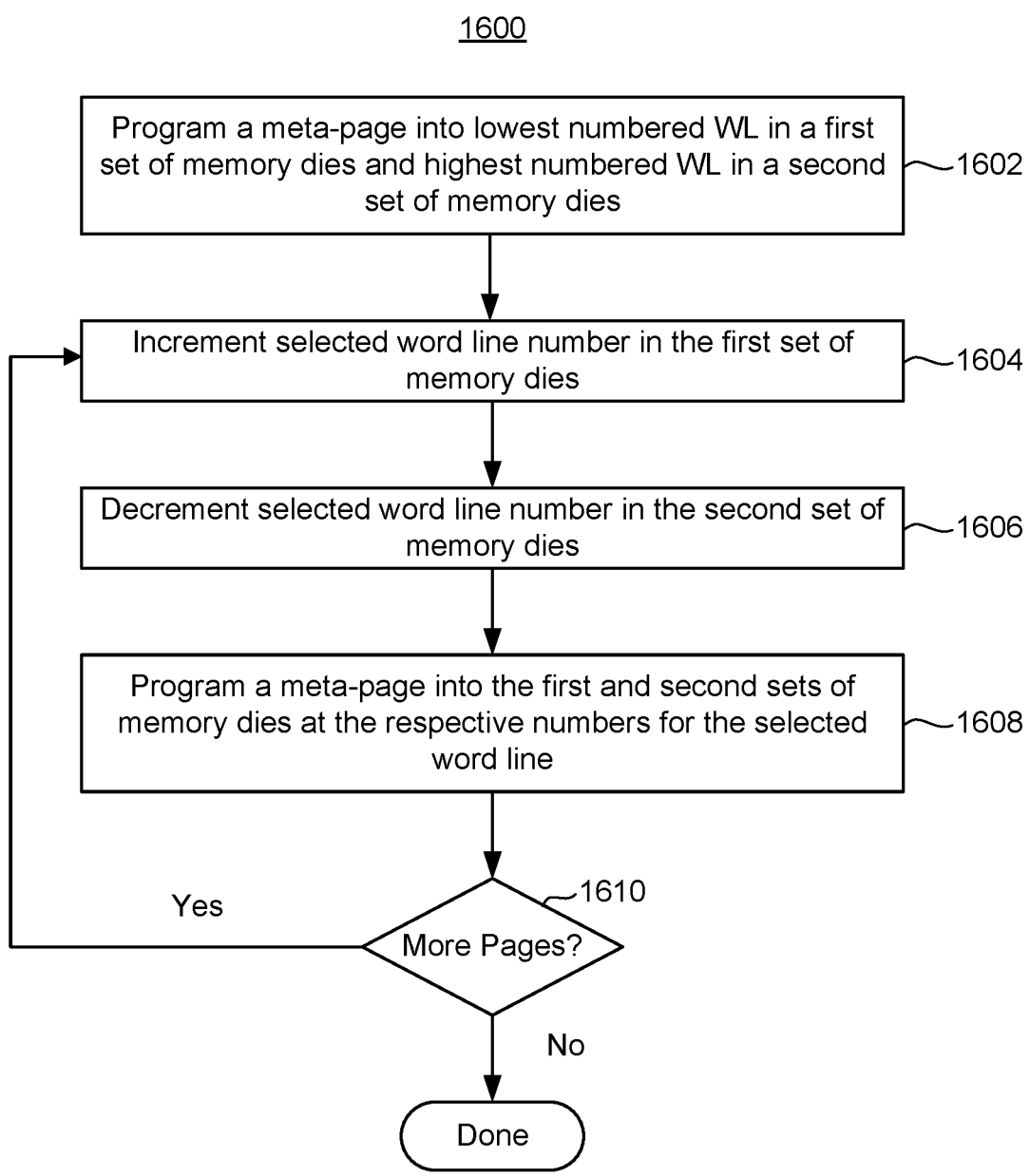
FIG. 16 depicts a flow chart of one embodiment of a process of programing meta-pages into non-volatile memory.

FIG. 16 depicts a flowchart of one embodiment of a process 1600 of programing meta-pages into non-volatile memory. The process 1600 will be explained with reference to FIGS. 15A-15D; however, process 1600 is not limited to the examples in FIGS. 15A-15D.

Step 1602 includes programming a meta-page into a lowest numbered word line in a first set of memory dies and into a highest word numbered word line in a second set of memory dies. Step 1602 may include concurrently programming a different physical page of the meta-page into each of the memory die. In one embodiment, the lowest numbered word line is closest to a source line and the highest numbered word line is closest to bit lines. In one embodiment, the lowest numbered word line is closest to a source end of NAND strings, and the highest numbered word line is closest to a drain end of NAND strings.

Step 1602 may include the controller 102 issuing an instruction to each memory die to program its respective physical page of the meta-page. In some embodiments, the controller 102 forms redundancy data from the physical pages of the meta-page. For example, the controller 102 forms a redundancy page by performing a bitwise XOR of the physical pages. The controller 102 may store the redundancy page in a spare memory die. In the event that one of the physical pages cannot be read from its physical location at a later time, the controller 102 may use the redundancy page to recover the contents of the physical page.

With reference to FIG. 15A, pages 0 to 11 are programmed into WL0 of die 0, die 2, die 4, and die 6. Also, pages 0 to 11 are programmed into WL95 of die 1, die 3, die 5, and die 7.

With reference to FIG. 15B, pages 0 to 2 are programmed into WL0/SB0 of die 0, pages 3 to 5 are programmed into WL0/SB1 of die 0, pages 6 to 8 are programmed into WL0/SB2 of die 0, and pages 6 to 8 are programmed into WL0/SB3 of die 0. Also, pages 0 to 2 are programmed into WL95/SB0 of die 0, pages 3 to 5 are programmed into WL95/SB1 of die 0, pages 6 to 8 are programmed into WL95/SB2 of die 0, and pages 6 to 8 are programmed into WL95/SB3 of die 0. FIG. 15C depicts an alternative for the order of programming sub-blocks for die 1.

In an embodiment consistent with FIG. 15D, pages 0 to 2 are programmed into WL0/SB0 of die 0. Also, pages 0 to 2 are programmed into WL95/SB3 of die 0. FIG. 15C depicts an alternative for the order of programming sub-blocks for die 1 in which pages 0 to 2 are programmed into WL95/SB0 of die 0.

Step 1604 include incrementing the number of the selected word line for the first set of memory dies.

Step 1606 includes decrementing the number of the selected word line for the second set of memory dies.

Step 1608 includes programming another meta-page into the current number for the selected word line in the first set of memory dies and into the current word line in the second set of memory dies. In an embodiment consistent with FIG. 15A, pages 12 to 23 are programmed into WL1 of die 0, die 2, die 4, and die 6. Also, pages 12 to 23 are programmed into WL94 of die 1, die 3, die 5, and die 7.

Step 1610 is a determination of whether there are more meta-pages to program. If so, control passes to step 1604. Steps 1604-1608 are performed to program the current meta-page into the memory dies. When there are no more meta-pages to program the process concludes. The process could conclude prior to programming all word lines. In this event, when there are more meta-pages to be programmed, the process could start where programming left off.

In some embodiments, the system programs NAND strings. In some embodiments, the NAND strings reside in a three-dimensional structure having one or more tiers. For example, FIG. 5A depicts a three-dimensional structure having two tiers. In some embodiments, the system treats each tier independently when it comes to program order reversal. However, the system is not required to treat each tier independently when it comes to program order reversal. Also, the NAND strings might reside in a single tier, as in an embodiment of FIG. 5B.

FIG. 17 is a flowchart of one embodiment of a process 1700 of programming a selected tier of two sets of NAND strings in different sequential orders. The process 1700 may be used to program NAND strings that reside in a three-dimensional structure. The three-dimensional structure has one or more tiers. Thus, in one embodiment, each NAND string resides in more than on tier. In one embodiment, each NAND string resides completely within a single tier. Each tier has a drain end and a source end, which is defined relative to the drain end and the source end of the NAND strings.

The selected tier that is programmed is at the same level of the three-dimensional structure for each set of NAND strings. For example, the selected tier could be the lower tier 508 for both NAND strings, or the selected tier could be the upper tier 510 for both sets of NAND strings (see FIG. 5A). In one embodiment, each set of NAND string resides in a single tier of a three-dimensional structure. For example, the selected tier could be the entire stack 556 in FIG. 5B.

In process 1700 the selected tier of one set of NAND strings is programmed in the reverse order of the selected tier of the other set of NAND strings. In one embodiment, the two sets of NAND strings reside in different sub-blocks of the same block. In one embodiment, the two sets of NAND strings reside in different blocks of the same memory die. In one embodiment, the two sets of NAND strings reside in different memory die. In one embodiment, the two sets of NAND strings reside in different blocks of a meta-block. Process 1700 is not limited to the foregoing examples.

Step 1702 includes programming first non-volatile memory cells in a first tier of a first set of NAND strings in a first three-dimensional structure in a first sequential order. The first non-volatile memory cells reside within the first tier of the first three-dimensional structure. The first sequential order is from the drain end to the source end of the first tier.

Step 1704 includes programming second non-volatile memory cells in a second tier of a second set of NAND strings of a second three-dimensional structure in a second sequential order. The second non-volatile memory cells reside within the second tier of the second three-dimensional structure. The second sequential order is from the source end to the drain end of the second tier. The second tier and the first tier are at the same level of the respective first and second three-dimensional structures. For example, the first and second tiers may each be the lower tier 508. As another example, the first and second tiers may each be the upper tier 510. In one embodiment, the NAND strings reside within a single tier, as in FIG. 5B.

FIG. 18A is a flowchart of one embodiment of a process 1800 programming non-volatile memory cells in lower tiers of two different blocks or sub-blocks. The process 1800 is used to program one lower tier in the reverse order of the other lower tier. Process 1800 provides further details for one embodiment of process 1700.

Step 1802 includes programming a lower tier of a first block or sub-block in a first sequential order from the source end of the lower tier to the drain end of the lower tier. Step 1802 may include sequentially programming word lines in the lower tier from the source end of the lower tier to the drain end of the lower tier. For example, with respect to FIG. 7A, the word lines are programmed sequentially from WL0 to WL47. In one embodiment, the word lines in a block (e.g., BLK0) are programmed. In one embodiment, the word lines in a sub-block (e.g., SB0) are programmed.

Step 1804 includes programming a lower tier of a second block or sub-block in a second sequential order from the drain end of the tier to the source end of the tier. Step 1804 may include sequentially programming word lines in the lower tier from the drain end of the lower tier to the source end of the lower tier. For example, with respect to FIG. 7A, the word lines are programmed sequentially from WL47 to WL0. In the event that a block was programmed in step 1802, then a block is programmed in step 1804. In the event that a sub-block was programmed in step 1802, then a sub-block is programmed in step 1804.

FIG. 18B is a flowchart of one embodiment of a process 1820 programming non-volatile memory cells in upper tiers of two different blocks or sub-blocks. The process 1820 is used to program one upper tier in the reverse order of the other upper tier. Process 1820 provides further details for one embodiment of process 1700. Process 1820 describes programming of an upper tier, whereas process 1800 describes programming of a lower tier. Hence process 1820 will not be described in detail. Step 1822 includes programming an upper tier of a first block or sub-block in a first sequential order from the source end of the lower tier to the drain end of the lower tier. Step 1822 may include sequentially programming word lines in the upper tier from the source end of the lower tier to the drain end of the lower tier. Step 1804 includes programming an upper tier of a second block or sub-block in a second sequential order from the drain end of the tier to the source end of the tier. Step 1824 may include sequentially programming word lines in the upper tier from the drain end of the lower tier to the source end of the lower tier.

Figure 19:
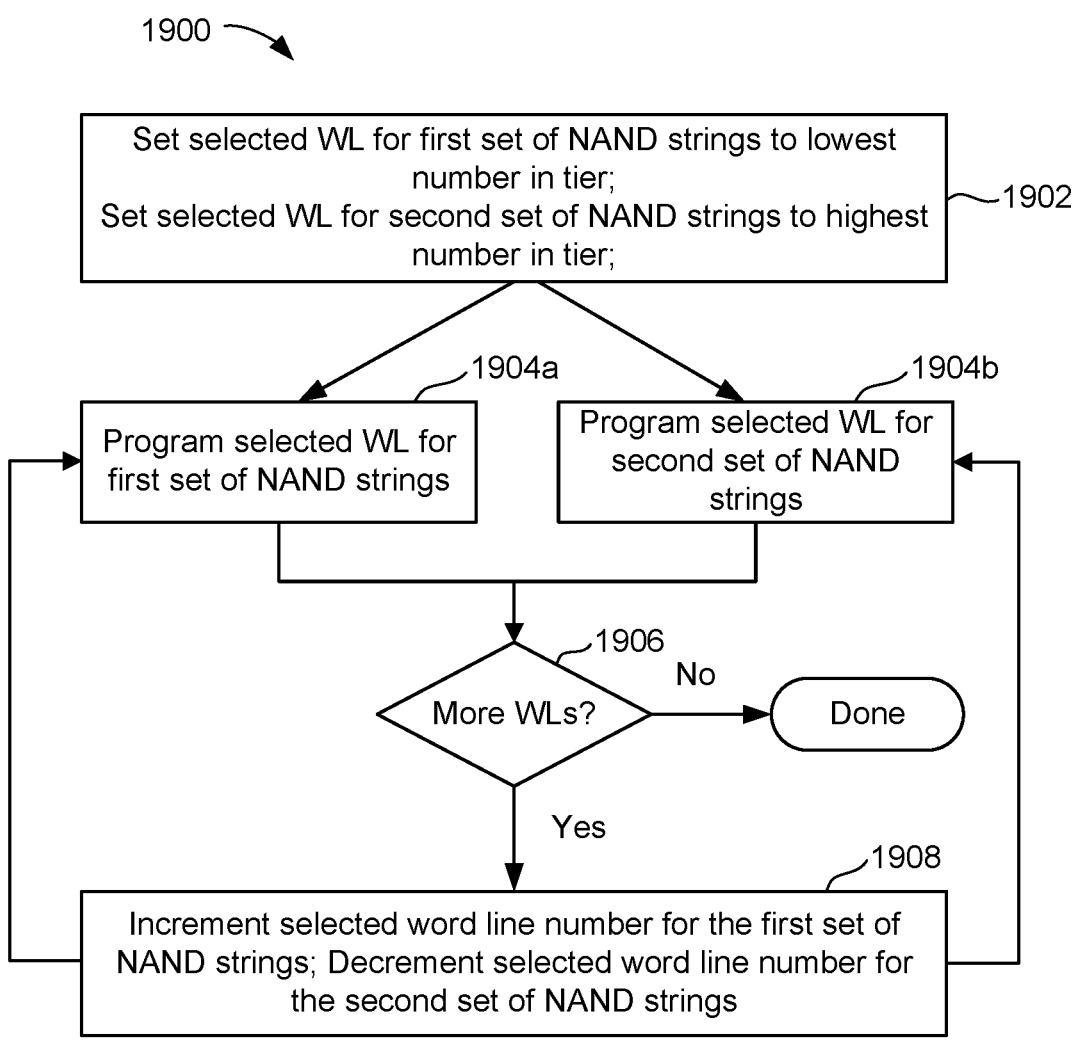
FIG. 19 depicts a flow chart of one embodiment of a process of programming one tier of one three-dimensional memory stricture in a reverse order from a tier of another three-dimensional memory structure.

FIG. 19 depicts a flowchart of one embodiment of a process 1900 of programming one tier of one three-dimensional memory stricture in a reverse order from a tier of another three-dimensional memory structure. The process 1900 provides further details for FIGS. 17, 18A and 18B.

Step 1902 includes setting a selected word line for a first set of NAND strings to a lowest numbered word line in a first tier. Step 1902 also includes setting a selected word line for a second set of NAND strings to a highest numbered word line for a second tier. As one example, if the first and second tiers are each lower tiers 508, then the selected word line for the first tier is set to WL0 and the selected word line for the second tier is set to WL47. As another example, if the first and second tiers are each upper tiers 510, then the selected word line for the first tier is set to WL48 and the selected word line for the second tier is set to WL95. As another example, if the three-dimensional structure has a single tier as in FIG. 5B, then the selected word line for the first tier is set to WL0 and the selected word line for the second tier is set to WL95. Step 1902 may be performed by the controller 102.

Step 1904 includes programming the selected word line for the first set of NAND strings. Step 1906 includes programming the selected word line for the second set of NAND strings. Step 1904 may include the controller 102 sending programming instructions to one or more memory die. A memory die 300 may perform the programming using, for example, state machine 312, on-chip address decoders 314, power control 316, row decoder 324, column decoder 332, and/or read write circuits 328. The read write circuits 328 contain sense blocks 350, which may be used to control voltages to bit lines during programming, as well as to sense bit lines during program verify.

Step 1906 includes a determination of whether there are more word lines to program. The controller 102 may perform step 1906. If there are more word lines to program, then control passes to step 1908. Step 1908 includes incrementing the selected word line for the first set of NAND strings. Step 1908 also includes decrementing the selected word line for the second set of NAND strings. Step 1908 may be performed by controller 102. After step 1908 control passes to step 1904. Recall that step 1904a is to program the selected word line for the first set of NAND strings and that step 1904b is to program the selected word line for the second set of NAND strings. When there are no more word lines to program in the tier (step 1906=no), the process concludes.

In some embodiment, the system reverses the order in which a particular NAND string is programmed. FIG. 20 is a flowchart of one embodiment of a process 2000 of reversing an order in which a NAND string is programmed. FIG. 20 describes programming an entire NAND string. The NAND string could be in a single tier structure such as the NAND strings in FIG. 5B, or a multi-tier structure such as the NAND strings in FIG. 5A. In one embodiment, the process 2000 is performed on NAND strings in a sub-block (e.g., SB0 in FIG. 7A). In one embodiment, the process 2000 is performed on NAND strings in a block (e.g., BLK0 in FIG. 7A). In one embodiment, the process 2000 is performed on NAND strings in a meta-block. The meta-block may be formed from blocks in different memory dies.

Step 2002 includes programming a NAND string in a three-dimensional structure in a first direction with respect to a top and a bottom of the NAND string. Step 2002 includes programming the NAND string from one end of the NAND string to the other end of the NAND string. In one embodiment, the NAND string is programmed sequentially from the source end to the drain end. In one embodiment, the NAND string is programmed sequentially from the drain end to the source end.

Step 2004 includes a determination of whether to reverse the sequential order in which the NAND string is programmed. In one embodiment, the determination is based on whether there is a defect within the sub-block or block as the NAND string. In one embodiment, the determination is based on whether there is a defect in a different sub-block or block as the NAND string.

If the determination is to not reverse the sequential order, then control passes to step 2002. If the determination is to reverse the sequential order, then control passes to step 2006. Note that a step of erasing the NAND string is not expressly depicted in FIG. 20, but the NAND string may be erased prior to performing step 2002 or 2006.

Step 2006 includes programming the NAND string in a second sequential order with respect to a top and a bottom of the NAND string. Step 2006 includes programming the NAND string from one end of the NAND string to the other end of the NAND string. If the NAND string was programmed sequentially from the source end to the drain end in step 2002 then the NAND string is programmed sequentially from the drain end to the source end in step 2006. If the NAND string was programmed sequentially from the drain end to the source end in step 2002 then the NAND string is programmed sequentially from the source end to the drain end in step 2006.

As noted above, some NAND strings may reside in a three-dimensional structure having multiple tiers. In some embodiments, the system reverses the order in which programming occurs in one tier, but does not necessarily reverse the order in which programming is performed in another tier. FIG. 21 is a flowchart of one embodiment of a process 2100 of reversing a sequential order in which a portion of a NAND string is programmed. The NAND string resides in a three-dimensional structure that has multiple tiers, such as in FIGS. 5A and 7A. The portion of the NAND string that is programmed contains memory cells in one tier of the three-dimensional structure. In one embodiment, the process 2100 is performed on NAND strings in a sub-block (e.g., SB0 in FIG. 7A). In one embodiment, the process 2100 is performed on NAND strings in a block (e.g., BLK0 in FIG. 7A). In one embodiment, the process 2100 is performed on NAND strings in a meta-block. The meta-block may be formed from blocks in different memory dies.

Step 2102 includes programming one tier of the NAND string in a first sequential order with respect to a top and a bottom of the tier. The tier has a drain end and source end that are defined with respect to the drain and source end of the NAND string. Step 2102 includes programming the NAND string from one end of the tier to the other end of the tier. In one embodiment, the NAND string is programmed sequentially from the source end to the drain end of the tier. In one embodiment, the NAND string is programmed sequentially from the drain end to the source end of the tier.

Step 2104 includes a determination of whether to reverse the sequential order in which the tier of the NAND string is programmed. In one embodiment, the determination is based on whether there is a defect within the sub-block or block as the NAND string. In one embodiment, the determination is based on whether there is a defect in a different sub-block or block as the NAND string.

If the determination is to not reverse the sequential order, then control passes to step 2102. If the determination is to reverse the sequential order, then control passes to step 2106. Note that a step of erasing the NAND string is not expressly depicted in FIG. 21, but the NAND string may be erased prior to performing step 2102 or 2106.

Step 2106 includes programming a NAND string in a second sequential order with respect to the top and the bottom of the tier. Step 2106 includes programming the NAND string from one end of the tier to the other end of the tier. If the NAND string was programmed sequentially from the source end to the drain end of the tier in step 2102, then the NAND string is programmed sequentially from the drain end to the source end of the tier in step 2106. If the NAND string was programmed sequentially from the drain end to the source end of the tier in step 2102, then the NAND string is programmed sequentially from the source end to the drain end of the tier in step 2106.

FIGS. 22A and 22B depicts tables to illustrate how reversing a program order can provide for a larger contiguous chunk of good word lines. FIG. 22A depicts a table 2202 that shows which physical word lines are good and bad in each of eight memory die. Word lines WL93, WL94, and WL95 are bad in memory die 0, die 3 and die 6. Word lines WL0, WL1, and WL2 are bad in memory die 1 and die 7. This leaves a contiguous chunk 2204 of good word lines between word lines WL3-WL92, which is 90 contiguous word lines.

FIG. 22B depicts a table 2212 that shows which what are referred to as logical word lines that result due to reversing the programming order in some of the dies. In particular, the word line programming order is reversed in memory die 1 and die 7, which are the die in which WL0-WL2 are bad. Reversing the word line programming order for these two memory die will in effect place the bad word lines at the end of the programming order. This is depicted in table 2212 by showing that the bad word lines are now logically at WL93, WL94 and WL95 for memory die 1 and die 7. The other memory die have not had their programming orders reversed. The net result is that the logically contiguous chunk 2214 of word lines is now from logical word line WL0 to WL92, which is 93 logical word lines. Hence, the contiguous chunk has grown from 90 word lines to 93 word lines by reversing the programming order in memory die 1 and die 7.

Having a larger contiguous chunk 2214 can make it easier to manage programming. As one example, meta-pages can be formed from the 93 good logical word lines in contiguous chunk 2214. With the smaller contiguous chunk 2204 one option is to not use any of word lines WL0, WL1, WL2, WL93, WL94 or WL95 in any of the die, which results in less storage than the example of FIG. 22B.

A first aspect of the disclosed technology includes a non-volatile storage device comprising non-volatile memory cells, word lines connected to the non-volatile memory cells, and a control circuit connected to the non-volatile memory cells and the word lines. The control circuit is configured to program a set of the word lines in a first sequential order. The control circuit is configured to erase the set of word lines after programming the set of the word lines in the first sequential order. The set of word lines comprises a unit of erase. The control circuit is configured to program the set of the word lines in a second sequential order after said erasing. The second sequential order is different from the first sequential order.

In a second aspect of the disclosed technology in furtherance of the first aspect, second sequential order varies the programming order by at least one of memory die, memory block and program/erase cycle.

In a third aspect of the disclosed technology in furtherance of the first or second aspects, the second sequential order is a reverse of the first sequential order.

In a fourth aspect of the disclosed technology in furtherance of any of the first to third aspects, the control circuit is further configured to reverse a direction of programming the set of the word lines from the first sequential order to the second sequential order in response to a determination that there is a defect in the non-volatile storage device.

In a fifth aspect of the disclosed technology in furtherance of either the first to fourth aspects, reverse a direction of programming the set of the word lines from the first sequential order to the second sequential order in response to a program/erase cycle count of the set of the word lines exceeding a threshold.

In a sixth aspect of the disclosed technology in furtherance of any of the first to fifth aspects, the set of the word lines is a first set of word lines. The control circuit is further configured to program a second set of the word lines in the first sequential order while concurrently programming the first set of the word lines in the second sequential order, the second set of the word lines comprise a unit of erase.

In a seventh aspect of the disclosed technology in furtherance of any of the first to sixth aspects, the control circuit is further configured to program a first physical page of a meta-page into a first word line of the first set of the word lines, and program a second physical page of the meta-page into a second word line of the second set of the word lines.

In an eighth aspect of the disclosed technology in furtherance of any of the first to seventh aspects, the control circuit is further configured to form redundancy data from the first physical page and the second physical page. The control circuit is further configured to store the redundancy data. The control circuit is further configured to use the redundancy data to recover either the first physical page or the second physical page.

In a ninth aspect of the disclosed technology in furtherance of any of the first to eighth aspects, the non-volatile storage device comprises a plurality of memory die, the first set of the word lines resides in a first memory die of the plurality of memory die, and the second set of the word lines resides in a second memory die of the plurality of memory die.

In a tenth aspect of the disclosed technology in furtherance of any of the first to ninth aspects, the non-volatile storage device further comprises a first three-dimensional structure in which the first set of word lines reside, and a second three-dimensional structure in which the second set of word lines reside. The first set of the word lines and the second set of the word lines reside in the same level of the respective first and second three-dimensional structures.

In an eleventh aspect of the disclosed technology in furtherance of any of the first to ninth aspects, the non-volatile memory cells are configured as NAND strings each having a drain end and a source end. Also, the control circuit is further configured to program the set of the word lines from the source end to the drain end to program the set of the word lines in the first sequential order. Also, the control circuit is further configured to program the set of word lines from the drain end to the source end to program the set of the word lines in the second sequential order.

In a twelfth aspect of the disclosed technology in furtherance of any of the first to eleventh aspects, the non-volatile storage device further comprises a three-dimensional structure comprising multiple tiers, the set of the word lines resides in a first tier of the three-dimensional structure. The control circuit is further configured to program the set of the word lines sequentially from a first end to a second end of the first tier in order to program the set of the word lines in the first sequential order. The control circuit is configured to program the set of the word lines sequentially from the second end to the first end of the first tier in order to program the set of the word lines in the second sequential order.

In a thirteenth aspect of the disclosed technology in furtherance of any of the first to twelfth aspects, the control circuit is configured to program each word line in the set of word lines using a multi-phase programming operation in which a final phase of the multi-phase programming operation of a first selected word line is completed after performing at least one phase of the multi-phase programming operation on a word line that is after the first selected word line in the first order.

One embodiment of the disclosed technology includes a method of operating non-volatile storage. The method comprises programming a subset of non-volatile memory cells on a NAND string in a three-dimensional structure in a first sequential order from a first end to a second end of the subset. The method comprises determining that there is a defect within the three-dimensional structure after programming the subset in the first sequential order. The method comprises erasing the subset of non-volatile memory cells after programming the subset in the first sequential order. The method comprises programming the subset of non-volatile memory cells in a second sequential order from the second end to the first end of the subset responsive to determining that there is the defect within the three-dimensional structure.

One embodiment of the disclosed technology includes a non-volatile storage device comprising a plurality of three-dimensional structures. Each three-dimensional structure comprises NAND strings comprising non-volatile memory cells. Each NAND string comprises a drain end and a source end. Each three-dimensional structure comprises one or more tiers. Each tier comprises a drain end and a source end defined relative to the drain end and the source end of the NAND strings. The non-volatile storage device further comprises means for programming first non-volatile memory cells on first NAND strings in a first tier of a first of the three-dimensional structures in a first order. The first non-volatile memory cells reside in the first tier. The non-volatile storage device further comprises means for programming second non-volatile memory cells on second NAND strings in a second tier of a second of the three-dimensional structures in a second order. The first tier and the second tier reside at the same level of the respective first and second three-dimensional structures.

The means for programming first non-volatile memory cells on first NAND strings in a first tier of a first of the three-dimensional structures in a first order include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming first NAND strings in a first tier of a first of the three-dimensional structures in a first order performs process 1900. In one embodiment, the means for programming first NAND strings in a first tier of a first of the three-dimensional structures in a first order performs process 1400.

The means for programming second non-volatile memory cells on second NAND strings in a second tier of second of the three-dimensional structures in a second order may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming second non-volatile memory cells on second NAND strings in a second tier of a second of the three-dimensional structures in a second order performs process 1900. In one embodiment, the means for programming second non-volatile memory cells on second NAND strings in a second tier of a second of the three-dimensional structures in a second order performs process 1400.

In one embodiment, the means for programming first non-volatile memory cells on first NAND strings in a first tier of a first of the three-dimensional structures in a first order comprises means for programming the first non-volatile memory cells in a first sequential order. In one embodiment, the means for programming second non-volatile memory cells on second NAND strings in a second tier of a second of the three-dimensional structures in a second order comprises means for programming the second non-volatile memory cells in a second sequential order that is a reverse of the first sequential order.

The means for programming first non-volatile memory cells on first NAND strings in a first of the three-dimensional structures in a first sequential order may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming first non-volatile memory cells on first NAND strings in a first of the three-dimensional structures in a first sequential order performs process 1900.

The means for programming the second non-volatile memory cells in a second sequential order that is a reverse of the first sequential order may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming the second non-volatile memory cells in a second sequential order that is a reverse of the first sequential order performs process 1900.

One embodiment of a non-volatile storage device further includes means for programming a first physical page of a meta-page into a first group of the first non-volatile memory cells; and means for programming a second physical page of the meta-page into a second group of the second non-volatile memory cells.

The means for programming a first physical page of a meta-page into a first group of the first non-volatile memory cells may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming a first physical page of a meta-page into a first group of the first non-volatile memory cells performs process 1600.

The means for programming a second physical page of the meta-page into a second group of the second non-volatile memory cells may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming a second physical page of a meta-page into a second group of the second non-volatile memory cells performs process 1600.

One embodiment of a non-volatile storage device further includes means for programming non-volatile memory cells on third NAND strings in a third tier of the one or more tiers of a third three-dimensional structure in the first sequential order from the source end to the drain end of the third tier, means for erasing the non-volatile memory cells on the third NAND strings after programming the non-volatile memory cells on the third NAND strings in the first sequential order, and means for programming the non-volatile memory cells on the third NAND strings in the second sequential order from the drain end to the source end of the third tier after said erasing.

The means for programming non-volatile memory cells on third NAND strings in a third tier of the one or more tiers of a third three-dimensional structure in the first sequential order from the source end to the drain end of the third tier may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming non-volatile memory cells on third NAND strings in a third tier of the one or more tiers of a third three-dimensional structure in the first sequential order from the source end to the drain end of the third tier performs process 1900.

The means for erasing the non-volatile memory cells on the third NAND strings after programming the non-volatile memory cells on the third NAND strings in the first sequential order may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for erasing the non-volatile memory cells on the third NAND strings after programming the non-volatile memory cells on the third NAND strings in the first sequential order performs the process of FIG. 10A.

The means for programming a second physical page of the meta-page into a second group of the second non-volatile memory cells may include one or more of controller 102, control circuitry 310 (which may include state machine 312, on-chip address decoders 314, power control 316), row decoder 324, column decoder 332, read write circuits 328, sand/or sense blocks 350. The controller 102 may include FEP 110 and BEP 112. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, the means for programming a second physical page of the meta-page into a second group of the second non-volatile memory cells performs process 1600.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage device, comprising:
   a three-dimensional structure comprising non-volatile memory cells, the three-dimensional structure comprising a first tier and a second tier;
   a plurality of word lines connected to the non-volatile memory cells, the plurality of word lines comprising a first set of word lines that reside in the first tier and a second set of word lines that reside in the second tier, wherein the first set of the word lines comprises a unit of erase, wherein the second set of the word lines comprises a unit of erase; and
   a control circuit connected to the plurality of word lines and the non-volatile memory cells, wherein the control circuit is configured to:
      program the first set of the word lines in a first sequential order from a first end to a second end of the first tier,
      erase the first set of the word lines after programming the first set of the word lines in the first sequential order, and
      program the first set of the word lines in a second sequential order from the second end to the first end of the first tier after said erasing after said erasing.

2. The non-volatile storage device of claim 1, wherein the control circuit is further configured to:
   reverse a direction of programming the first set of the word lines from the first sequential order to the second sequential order in response to a determination that there is a defect in the non-volatile storage device.

3. The non-volatile storage device of claim 1, wherein the control circuit is further configured to:
   reverse a direction of programming the first set of the word lines from the first sequential order to the second sequential order in response to a program/erase cycle count of the first set of the word lines exceeding a threshold.

4. The non-volatile storage device of claim 1, wherein the control circuit is configured to:
   program each word line in the first set of the word lines using a multi-phase programming operation in which a final phase of the multi-phase programming operation of a first selected word line is completed after performing at least one phase of the multi-phase programming operation on a word line that is after the first selected word line in the first sequential order.

5. A method of operating non-volatile storage, the method comprising:
   programming a subset of non-volatile memory cells on a NAND string in a block in a three-dimensional structure in a first sequential order from a first end to a second end of the subset;
   determining, by an error correcting code (ECC) engine that a bit error rate within the block exceeds a threshold after programming the subset in the first sequential order;
   erasing the subset of non-volatile memory cells after programming the subset in the first sequential order; and
   programming the subset of non-volatile memory cells in a second sequential order from the second end to the first end of the subset responsive to determining that the bit error rate within the block exceeds the threshold.

6. The method of claim 5, wherein the subset of non-volatile memory cells on the NAND string is a first subset of non-volatile memory cells on a first NAND string that resides in a first block on a memory die, and the method further comprising:
programming a second subset of non-volatile memory cells on a second NAND string in a second block in the first sequential order concurrently with programming the first subset on the first NAND string in the second sequential order.

7. The method of claim 6, wherein programming the second subset of non-volatile memory cells on the second NAND string in the second block in the first sequential order concurrently with programming the first subset on the first NAND string in the second sequential order comprises:
issuing a first instruction to a first memory die to program the first NAND string; and
issuing a second instruction to a second memory die to program the second NAND string.

8. A non-volatile storage device, comprising:
a plurality of three-dimensional structures, each three-dimensional structure comprising NAND strings comprising non-volatile memory cells, each NAND string comprising a drain end and a source end, each three-dimensional structure comprising a plurality of tiers, each tier in a respective three-dimensional structure resides at a different level of the respective three-dimensional structure, each tier comprising a drain end and a source end defined relative to the drain end and the source end of the NAND strings;
means for programming first non-volatile memory cells on first NAND strings in a first tier of a first of the three-dimensional structures in a first order, wherein the first non-volatile memory cells reside in the first tier; and
means for programming second non-volatile memory cells on second NAND strings in a second tier of a second of the three-dimensional structures in a second order that is different from the first order, wherein the first tier and the second tier reside at the same level of the respective first and second three-dimensional structures.

9. The non-volatile storage device of claim 8, wherein:
the first order is a first sequential order from the source end to the drain end of the first tier; and
the second order is a second sequential order from the drain end to the source end of the second tier, the second sequential order is a reverse of the first sequential order.

10. The non-volatile storage device of claim 9, further comprising:
a plurality of memory die, wherein the first three-dimensional structure resides on a first memory die, wherein the second three-dimensional structure resides on a second memory die;
means for programming a first physical page of a meta-page into a first group of the first non-volatile memory cells; and
means for programming a second physical page of the meta-page into a second group of the second non-volatile memory cells.

11. The non-volatile storage device of claim 9, further comprising:
means for programming non-volatile memory cells on third NAND strings in a third tier of the one or more tiers of a third three-dimensional structure in the first sequential order from the source end to the drain end of the third tier;
means for erasing the non-volatile memory cells on the third NAND strings after programming the non-volatile memory cells on the third NAND strings in the first sequential order; and
means for programming the non-volatile memory cells on the third NAND strings in the second sequential order from the drain end to the source end of the third tier after said erasing.

12. A non-volatile storage device, comprising:
non-volatile memory cells;
word lines connected to the non-volatile memory cells, the word lines comprising a first set of word lines and a second set of word lines, wherein the first set of the word lines comprises a unit of erase, wherein the second set of the word lines comprises a unit of erase; and
a control circuit connected to the word lines and the non-volatile memory cells, wherein the control circuit is configured to:
program the first second set of word lines in a first sequential order while programming the second set of word lines in a second sequential order that is a reverse of the first sequential order.

13. The non-volatile storage device of claim 12, wherein the control circuit is further configured to:
program a first physical page of a meta-page into a first word line of the first set of the word lines; and
program a second physical page of the meta-page into a second word line of the second set of the word lines.

14. The non-volatile storage device of claim 13, wherein the control circuit is further configured to:
form redundancy data from the first physical page and the second physical page;
store the redundancy data; and
use the redundancy data to recover either the first physical page or the second physical page.

15. The non-volatile storage device of claim 12, wherein:
the non-volatile storage device comprises a plurality of memory die;
the first set of the word lines resides in a first memory die of the plurality of memory die; and
the second set of the word lines resides in a second memory die of the plurality of memory die.

16. The non-volatile storage device of claim 12, further comprising:
a first three-dimensional structure in which the first set of the word lines reside; and
a second three-dimensional structure in which the second set of the word lines reside, the first set of the word lines and the second set of the word lines reside in the same level of the respective first and second three-dimensional structures.

17. The non-volatile storage device of claim 12, wherein the control circuit is further configured to:
prior to programing the first set of the word lines in the first sequential order while programming the second set of the word lines in the second sequential order:
program the second set of the word lines in the first sequential order; and
erase the second set of the word lines after programming second first set of the word lines in the first sequential order.

18. A non-volatile storage device, comprising:

a plurality of memory die, each memory die comprises a three-dimensional structure, each three-dimensional structure comprising NAND strings comprising non-volatile memory cells, each NAND string comprising a drain end and a source end, each three-dimensional structure comprising one or more tiers, each tier comprising a drain end and a source end defined relative to the drain end and the source end of the NAND strings; and a control circuit that:

programs first non-volatile memory cells on first NAND strings in a first tier of a first of the three-dimensional structures in a first sequential order from the source end to the drain end of the first tier, wherein the first non-volatile memory cells reside in the first tier;

programs second non-volatile memory cells on second NAND strings in a second tier of a second of the three-dimensional structures in a second sequential order from the drain end to the source end of the second tier, the second sequential order is a reverse of the first sequential order, wherein the first tier and the second tier reside at the same level of the respective first and second three-dimensional structures;

programs a first physical page of a meta-page into a first group of the first non-volatile memory cells; and programs a second physical page of the meta-page into a second group of the second non-volatile memory cells.

* * * * *